United States Patent [19]
Netsu et al.

[11] Patent Number: 6,003,527
[45] Date of Patent: Dec. 21, 1999

[54] CLEANING APPARATUS AND A CLEANING METHOD

[75] Inventors: Shigeyoshi Netsu, Kualo Lumpur, Malaysia; Yasuyuki Harada, Tama; Kazuhiko Shiba, Shizuoka, both of Japan

[73] Assignees: Pre-Tech Co., Ltd.; Shin_Etsu Handotai Co., Ltd., Japan

[21] Appl. No.: 08/958,312

[22] Filed: Oct. 27, 1997

[30] Foreign Application Priority Data

Oct. 30, 1996 [JP] Japan .................................. 8-288481

[51] Int. Cl.⁶ ........................................ B08B 3/10
[52] U.S. Cl. ...................... 134/1.3; 134/25.4; 134/902; 134/184; 134/198
[58] Field of Search ....................... 134/115 R, 1, 134/1.3, 198, 25.4, 18, 902; 68/13 A; 239/704, 706

[56] References Cited

U.S. PATENT DOCUMENTS

| | | |
|---|---|---|
| 4,064,885 | 12/1977 | Dussault ................................. 134/58 R |
| 4,132,567 | 1/1979 | Blackwood ................................. 134/1 |
| 4,326,553 | 4/1982 | Hall ........................................ 134/153 |
| 4,994,051 | 2/1991 | Porter ......................................... 4/638 |
| 5,364,512 | 11/1994 | Earl ......................................... 204/228 |
| 5,368,054 | 11/1994 | Koretsky ................................. 134/153 |
| 5,591,334 | 1/1997 | Shimizu ................................. 210/243 |
| 5,762,779 | 6/1998 | Shiramizu ................................. 205/746 |
| 5,779,796 | 7/1998 | Tomoeda ................................. 118/319 |

*Primary Examiner*—Frankie L. Stinson
*Attorney, Agent, or Firm*—Nixon & Vanderhye

[57] ABSTRACT

In a cleaning apparatus, a cleaning solution spray means itself is given a function of producing $OH^-$ ionized water and $H^+$ ionized water and can spray $OH^-$ ionized water and $H^+$ ionized water, as cleaning solutions immediately after they are produced, upon a substrate to be cleaned, and one of $OH^-$ ionized water and $H^+$ ionized water can be selectively used as a cleaning solution. This cleaning apparatus includes a substrate holding member for holding a substrate to be cleaned, and a cleaning solution spray member for spraying a cleaning solution upon the substrate. The cleaning solution spray member includes an electrolytic ion generating member for radical-activating or ionizing pure water, and an ultrasonic wave generating member for spraying the radical-activated or ionized pure water, by carrying it on ultrasonic waves, upon the substrate.

23 Claims, 11 Drawing Sheets

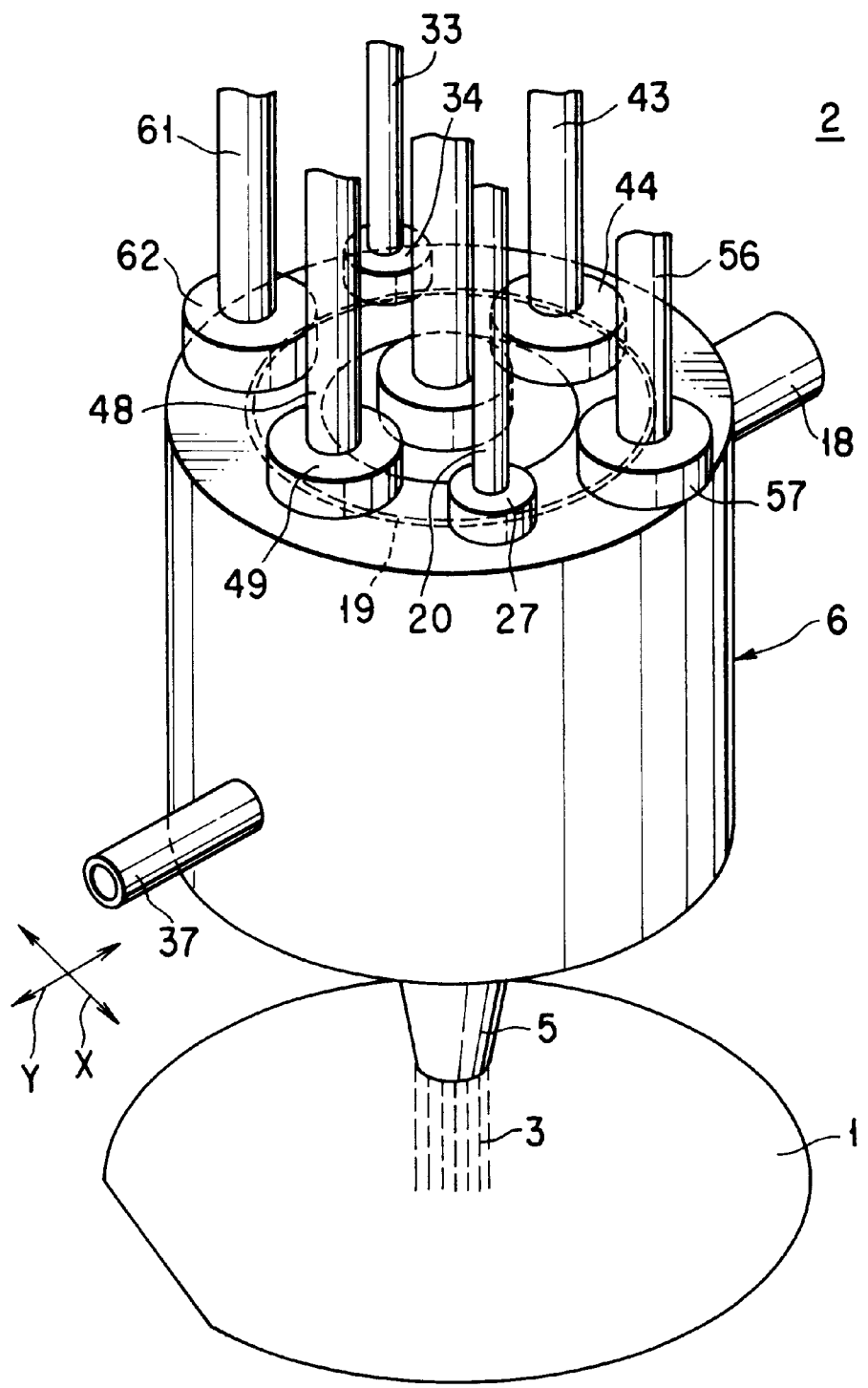
F I G. 1

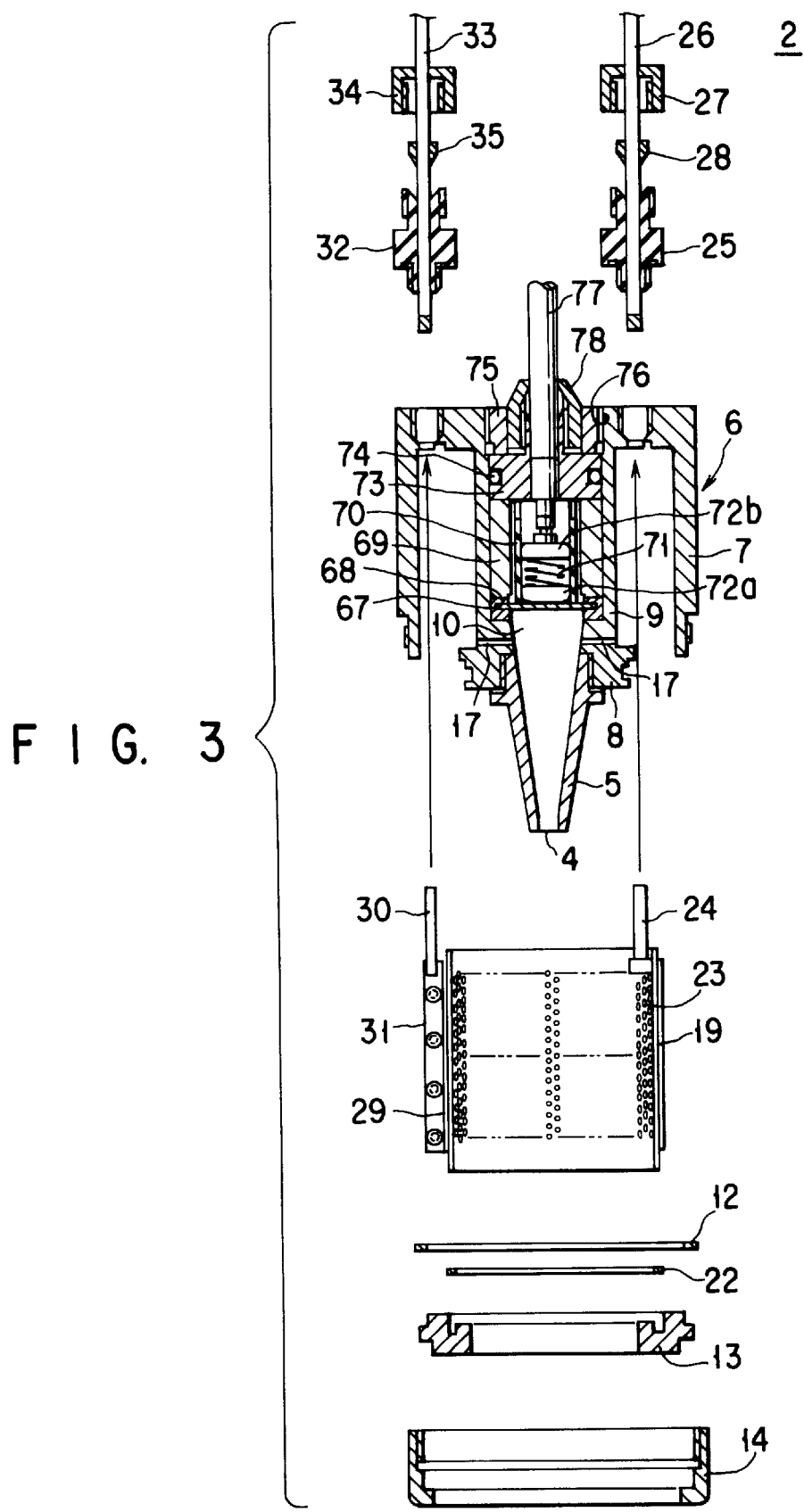

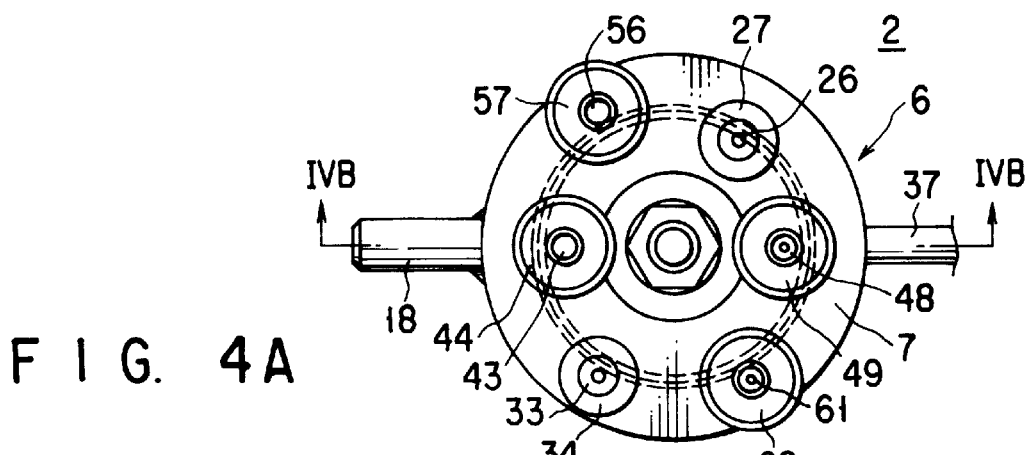
F I G. 4A
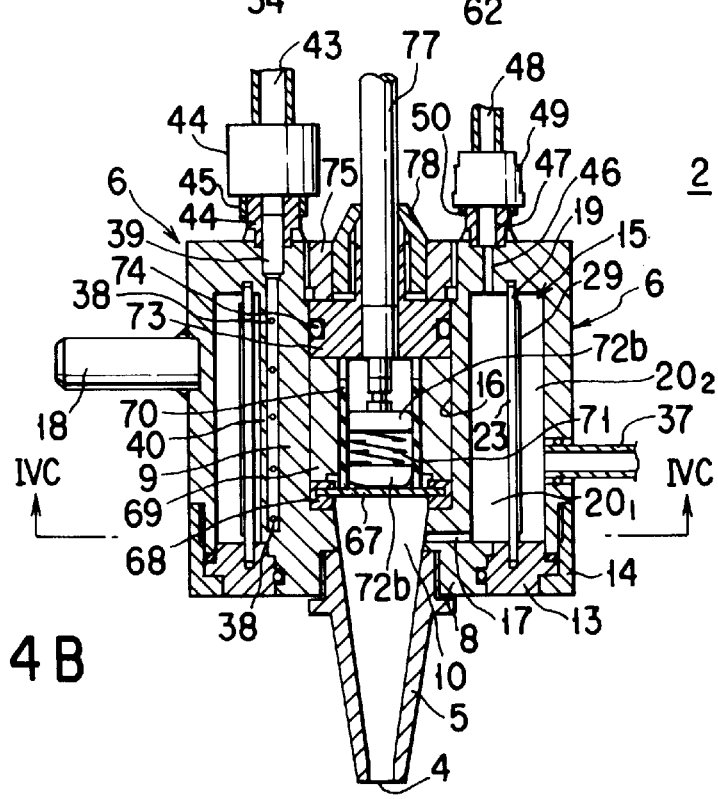
F I G. 4B
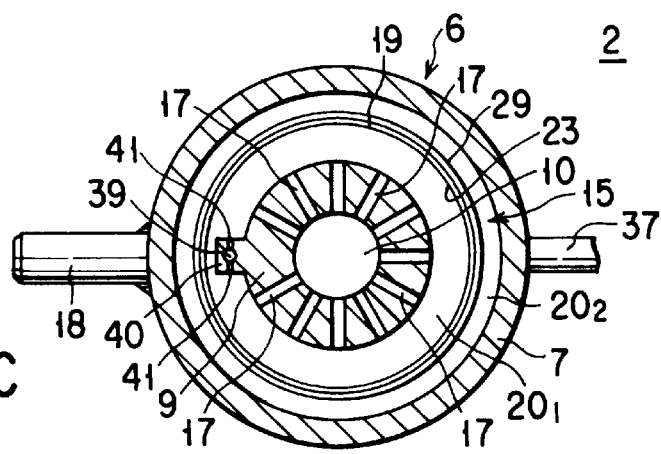
F I G. 4C

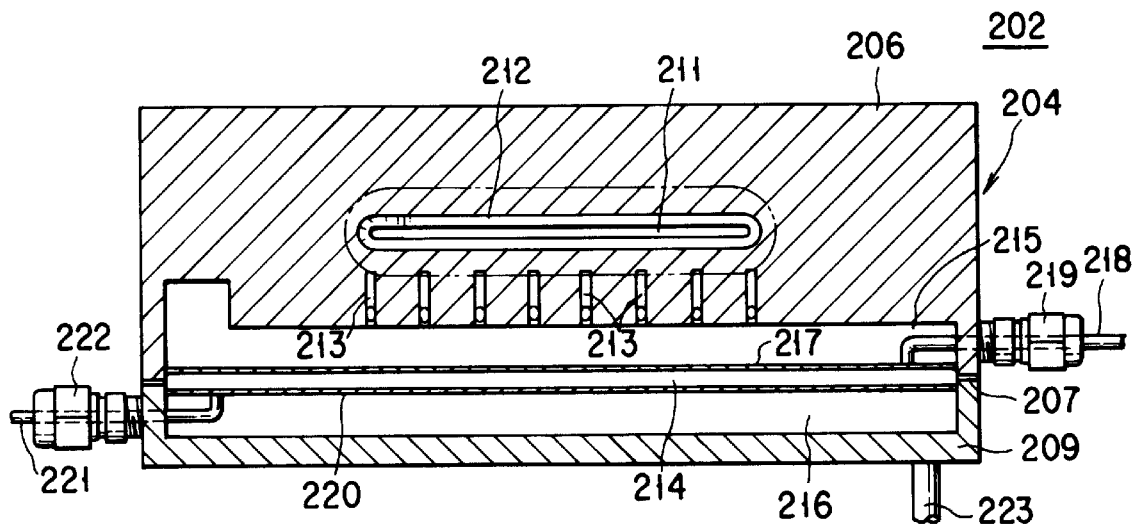
F I G. 13
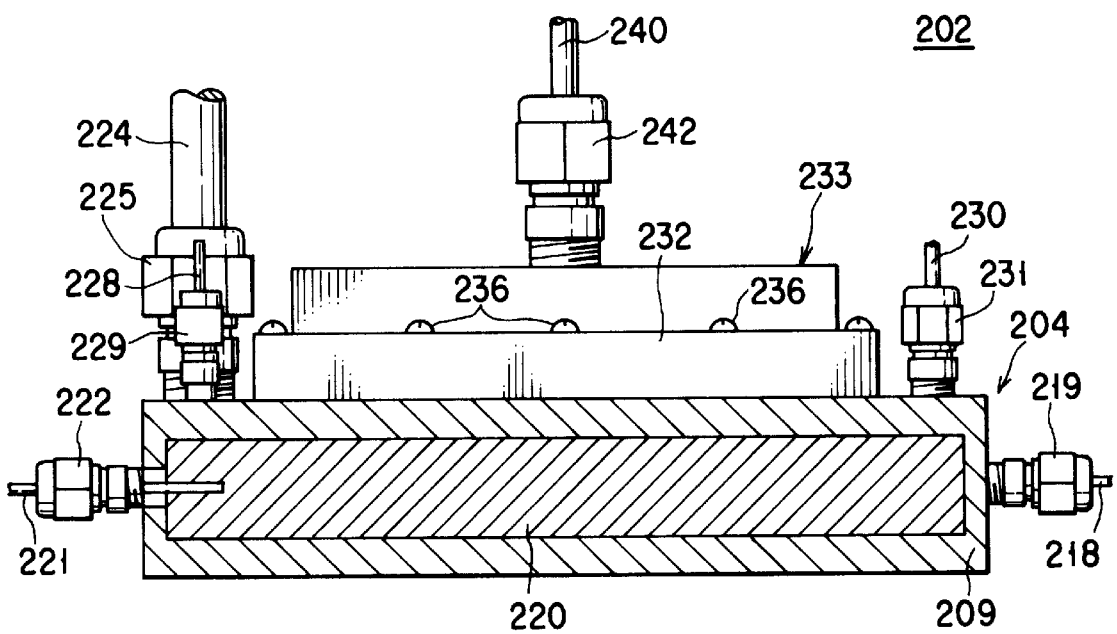
F I G. 14

CLEANING APPARATUS AND A CLEANING METHOD

BACKGROUND OF THE INVENTION

The present invention relates to a cleaning apparatus and a cleaning method of cleaning a substrate to be cleaned such as a semiconductor substrate (semiconductor wafer), a liquid crystal glass substrate, or a magnetic disk and, more particularly, to a cleaning apparatus and a cleaning method which achieve a remarkable cleaning effect in cleaning steps in the manufacture of silicon single-crystal wafers or cleaning steps during the course of fabricating semiconductor devices by using these wafers.

Semiconductor wafers, liquid crystal glass substrates, and magnetic disks must be cleaned whenever they are processed because various films and patterns are formed on them.

The degree of integration of semiconductor devices using semiconductor wafers as base materials continues to increase year by year. Accordingly, it is becoming more and more important to keep a high cleanliness in an environment in which semiconductor devices are fabricated and to clean wafers as the base materials.

One principal purpose of wafer cleaning is to remove particles and contamination, such as metal impurities, organic substances, surface films (natural oxide films and surface adsorbed substances) sticking to the wafer surface. A second purpose is to make the planarization of the wafer surface more perfect to eliminate troubles in the fabrication of semiconductor devices, thereby increasing the fabrication yield and improving the reliability as devices.

As conventional wafer cleaning methods, RCA cleaning developed by Mr. Kern et al. of RCA Corp. in the 1960s is best known to those skilled in the art. A representative cleaning sequence based on this method has two stages. In the first stage, particles and organic substances are removed by an SC-1 (RCA Standard Clean-1) cleaning solution based on ammonia/hydrogen peroxide/water ($NH_4OH/H_2O_2/H_2O$). In the second stage, metal contamination is removed by an SC-2 (RCA standard Clean-2) cleaning solution based on hydrogen chloride/hydrogen peroxide/water ($HCl/H_2O_2/H_2O$). DHF (Dilute HF) cleaning for removing surface films by using hydrogen fluoride/water ($HF/H_2O$) is also combined with the above basic combination in some cases.

The SC-1 cleaning solution used in the RCA cleaning method removes particles and organic substances from the wafer surface by using an etching action of ammonia contained in the cleaning solution.

Unfortunately, a silicon single-crystal ingot pulled by the CZ method contains crystal defects called as-grown defects formed during the growth of the ingot. Therefore, when the resultant wafer surface is etched, portions having these defects are etched faster than portions having no defects. Consequently, the etching of the defective portions selectively proceeds to form fine pits in the wafer surface. When a laser beam is irradiated on the surface of the wafer having these pits to measure particles on the wafer surface by using a particle counter for measuring the scattered light (bright points), the scattered light from each pit is also detected. This makes the measurement of a true particle count impossible. This pit is called a COP (Crystal Originated Particle).

The COP can deteriorate the electrical breakdown voltage characteristic of a gate oxide film of a semiconductor device. Therefore, as the packing density of semiconductor devices continues to increase, a countermeasure against the COP which has not been given serious consideration has also become an important problem to be solved.

The SC-1 cleaning solution has a high removing effect on a metal such as Cu which easily forms a complex with ammonia. However, the detergency of the SC-1 cleaning solution to metal impurities is generally inferior to those of cleaning solutions using acids.

On the other hand, the SC-2 cleaning solution has a remarkable cleaning effect on metal impurities, although its detergency to particles and organic substances is weak. However, a silicon oxide film is formed on the wafer surface due to hydrogen peroxide contained in the chemical solution. Therefore, the effect of this cleaning solution is believed to weaken if the concentration of metal impurities is high.

The cleaning method using the chemical solutions as described above dissolves metals such as exposed aluminum used as interconnections in a cleaning step during the course of fabricating semiconductor devices. Also, during this cleaning even interconnections buried in interlayers may corrode through fine gaps or pinholes. This imposes limitations on the use of the cleaning method.

As described above, the conventional cleaning methods represented by the RCA method have the problems stemming from the chemical solutions such as ammonia and acids used in the cleaning steps. Additionally, three or four types of cleaning solutions having different cleaning purposes and effects are used in combination. This necessarily prolongs the cleaning steps and requires multiple stages of apparatuses and multiple chemical solutions. Multiple steps resulting from the chemical solution cleaning eventually increase the installation cost, the labor cost, and the cost of materials such as chemical solutions and pure water. Also, the cost of countermeasures against environmental pollution such as waste liquors reaches a considerable amount.

To solve these problems, a cleaning method by which the use of chemical solutions is minimized or, if possible, no chemical solutions are used, is described in Jpn. Pat. Appln. KOKAI Publication No. 6-260480.

That is, in the invention described in the above publication, a cathode bar and an anode bar are disposed in two chambers, isolated by a porous film, of an electrolytic bath. Pure water containing a small amount of a substance which increases the electrolytic efficiency is supplied into the two isolated chambers to produce $OH^-$ ionized water on the cathode side and $H^+$ ionized water on the anode side. These two ionized waters are introduced to two processing baths provided as separate chambers to clean objects to be cleaned.

In this cleaning method, the processing on the $OH^-$ ionized water side is deemed equivalent to the SC-1 cleaning in the RCA cleaning method described above. Jpn. Pat. Appln. KOKAI Publication No. 6-260480 describes that $OH^-$ ions exclusively stabilize the surface of aluminum activated by the $H^+$ ion processing or removes colloidal silica remaining after a polishing or planarization process. However, this publication does not describe the removal of general particles as the principal object of the conventional SC-1 cleaning nor a more positive effect as a countermeasure against the COP which is a shortcoming of the method.

On the other hand, the processing on the $H^+$ ionized water side is equivalent to the SC-2 cleaning in the RCA cleaning method because the purpose of the processing is to exclusively remove metal contamination from a silicon wafer. However, the above publication describes that the applied voltage in this processing must be a high DC voltage of $10^3$ to $10^4$ V/cm, so the processing is extremely dangerous. Also, the $OH^-$ ionized water and the $H^+$ ionized water produced in the two isolated chambers consist of unstable ions and return to neutral solutions with a passage of time. Therefore, the concentrations of these ionized waters lower before the waters reach the two processing baths provided as separate chambers. Consequently, the effects of these ionized waters weaken or their concentrations become difficult to control.

BRIEF SUMMARY OF THE INVENTION

It is an object of the present invention to provide a cleaning apparatus in which a cleaning solution spray means itself is given a function of producing $OH^-$ ionized water and $H^+$ ionized water and can spray $OH^-$ ionized water and $H^+$ ionized water, as cleaning solutions immediately after they are produced, upon an object to be cleaned, and one of $OH^-$ ionized water and $H^+$ ionized water can be selectively used as a cleaning solution.

It is another object of the present invention to provide a cleaning apparatus in which a cleaning solution spray means itself is given a function of producing $OH^-$ ionized water and $H^+$ ionized water and can spray $OH^-$ ionized water and $H^+$ ionized water, as cleaning solutions immediately after they are produced, by carrying them on ultrasonic waves, upon an object to be cleaned, and one of $OH^-$ ionized water and $H^+$ ionized water can be selectively used as a cleaning solution.

It is still another object of the present invention to provide a cleaning method capable of precisely cleaning a substrate to be cleaned by using the above cleaning apparatuses without increasing the number of steps.

It is still another object of the present invention to provide a cleaning apparatus capable of precisely cleaning both the upper and lower surfaces of a rotatable substrate to be cleaned at the same time by arranging a cleaning solution spray means given a function of producing $OH^-$ ionized water and $H^+$ ionized water above the substrate and arranging another cleaning solution spray means having the same structure or a different structure below the substrate.

A cleaning apparatus according to the present invention comprises:

substrate holding means for holding a substrate to be cleaned; and cleaning solution spray means, having an electrolytic ion generating member for radical-activating or ionizing pure water, for spraying a cleaning solution upon the substrate.

Another cleaning apparatus according to the present invention comprises:

substrate holding means for holding a substrate to be cleaned; and cleaning solution spray means for spraying a cleaning solution upon the substrate, wherein the cleaning solution spray means comprises (a) a cylindrical main body having a nozzle in one end of which a circular cleaning solution discharge port is open, (b) a partition concentrically arranged in the main body to partition the main body into a first space in an outer portion and a second space positioned in a central portion and communicating with the nozzle, (c) a plurality of cleaning solution passages formed in a portion of the partition near the nozzle and communicating with the first and second spaces, (d) an electrolytic ion generating member concentrically arranged in the first space and comprising an $H^+$ ion exchange membrane for partitioning the first space into an outside processing chamber and an inside processing chamber, electrode plates disposed on both sides of the $H^+$ ion exchange membrane and having different polarities, and a DC power supply connected to the electrode plates, the electrolytic ion generating member produces radical-activating or ionizing pure water, and (e) an ultrasonic wave generating member arranged in the second space, and a radical-activated or ionized cleaning solution produced in the inside processing chamber of the $H^+$ ion exchange membrane is introduced into the second space through the cleaning solution passages in the partition and sprayed upon the substrate from the nozzle by ultrasonic waves from the ultrasonic wave generating member.

Still another cleaning apparatus according to the present invention comprises:

rotating means for horizontally rotating a substrate to be cleaned;

first cleaning solution spray means, arranged above the rotating means, for spraying a cleaning solution upon an upper surface of the substrate supported by the rotating means; and second cleaning solution spray means, arranged below the rotating means, for spraying a cleaning solution upon a lower surface of the substrate supported by the rotating means, wherein the first cleaning solution spray means comprises (a) a cylindrical main body having a nozzle in one end of which a circular cleaning solution discharge port is open, (b) a partition concentrically arranged in the main body to partition the main body into a first space in an outer portion and a second space positioned in a central portion and communicating with the nozzle, (c) a plurality of cleaning solution passages formed in a portion of the partition near the nozzle and communicating with the first and second spaces, (d) an electrolytic ion generating member concentrically arranged in the first space and comprising an $H^+$ ion exchange membrane for partitioning the first space into an outside processing chamber and an inside processing chamber, electrode plates disposed on both sides of the $H^+$ ion exchange membrane and having different polarities, and a DC power supply connected to the electrode plates, the electrolytic ion generating member produces radical-activating or ionizing pure water, and (e) an ultrasonic wave generating member arranged in the second space, and a radical-activated or ionized cleaning solution produced in the inside processing chamber of the $H^+$ ion exchange membrane is introduced into the second space through the cleaning solution passages in the partition and sprayed upon the rotating substrate from the nozzle by ultrasonic waves from the ultrasonic wave generating member.

Still another cleaning apparatus according to the present invention comprises:

substrate holding means for holding a substrate to be cleaned; and cleaning solution spray means for spraying a cleaning solution upon the substrate, wherein the cleaning solution spray means comprises (a) a rectangular main body comprising a nozzle hole in a lower surface of which an elongated cleaning solution discharge port is open, and an elongated processing chamber communicating with the nozzle hole, (b) an electrolytic ion generating member comprising an elongated $H^+$ ion exchange membrane for partitioning the processing chamber in the main body into inside and outside processing chambers communicating with the nozzle hole along a longitudinal direction, elongated electrode plates disposed on both sides of the $H^+$ ion exchange membrane and having different polarities, and a DC power supply connected to the electrode plates, the electrolytic ion generating member produces radical-activating or ionizing pure water, and (c) an ultrasonic wave generating member arranged on an upper surface of the main body to propagate ultrasonic waves to a cleaning solution in the nozzle hole, and a radical-activated or ionized cleaning solution produced in the inside processing chamber of the $H^+$ ion exchange membrane is introduced into the nozzle hole and sprayed in the form of a belt upon the substrate from the elongated discharge port of the nozzle hole by the ultrasonic waves from the ultrasonic wave generating member.

A cleaning method according to the present invention is a cleaning method of cleaning a substrate to be cleaned by using a cleaning apparatus comprising:

substrate holding means for holding the substrate; and cleaning solution spray means comprising an electrolytic ion generating member having an $H^+$ ion exchange membrane for partitioning an outside processing chamber and a central processing chamber and electrode plates disposed on both sides of the $H^+$ ion exchange membrane and having different polarities, wherein pure water is supplied to the outside and central processing chambers while a DC voltage is applied to the electrode plates having different polarities, and a cleaning solution produced by radical-activating or ionizing the pure water in the central processing chamber is sprayed upon the substrate, thereby cleaning the substrate.

Another cleaning method according to the present invention is a cleaning method of cleaning a substrate to be cleaned by using a cleaning apparatus comprising:

substrate holding means for holding the substrate; and cleaning solution spray means comprising an ultrasonic wave generating member, and an electrolytic ion generating member having an $H^+$ ion exchange membrane for partitioning an outside processing chamber and a central processing chamber and electrode plates disposed on both sides of the $H^+$ ion exchange membrane and having different polarities, wherein pure water is supplied to the outside and central processing chambers while a DC voltage is applied to the electrode plates having different polarities, ultrasonic waves are simultaneously propagated from the ultrasonic wave generating member to the pure water flowing through the central processing chamber, and a cleaning solution produced by radical-activating or ionizing the pure water is carried on the ultrasonic waves and sprayed upon the substrate, thereby cleaning the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a perspective view showing a cleaning apparatus according to the present invention;

FIG. 3 is an exploded view of the cylindrical cleaning solution spray in FIG. 1;

FIG. 4A is a top view showing the cylindrical cleaning solution spray in FIG. 1;

FIG. 4B is a sectional view taken along a line B—B in FIG. 4A;

FIG. 4C is a sectional view taken along a line C—C in FIG. 4B;

FIG. 13 is a sectional view of the bar type cleaning solution spray taken along a line XIII—XIII in FIG. 12; and FIG. 14 is a sectional view of the bar type cleaning solution spray taken along a line IVX—IVX in FIG. 12.

DETAILED DESCRIPTION OF THE INVENTION

A cleaning apparatus according to the present invention will be described in detail below with reference to FIGS. 1 to 6.

Figure 2A:
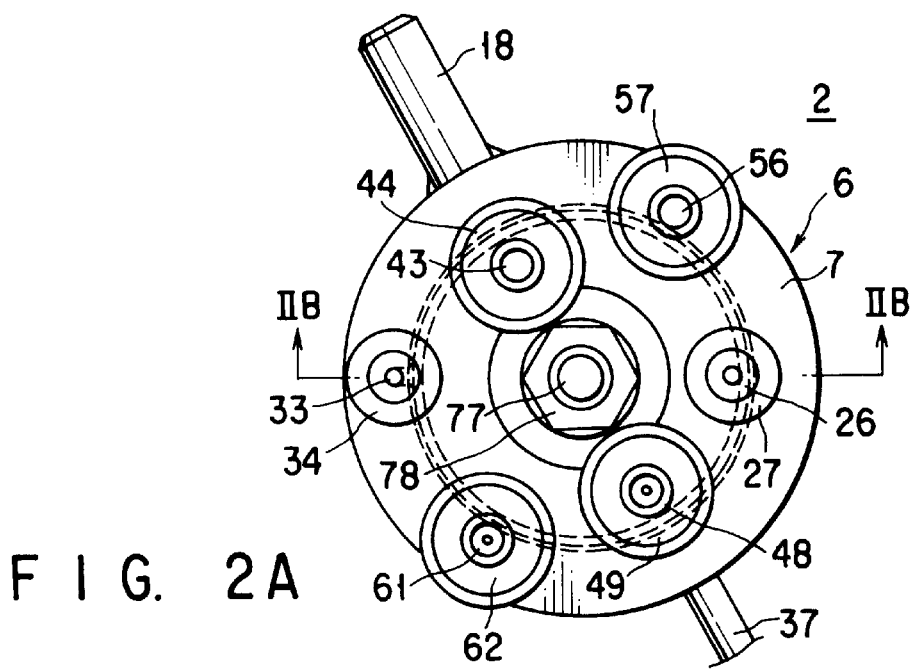
FIG. 2A is a top view showing a cylindrical cleaning solution spray in FIG. 1.
Figure 2B:
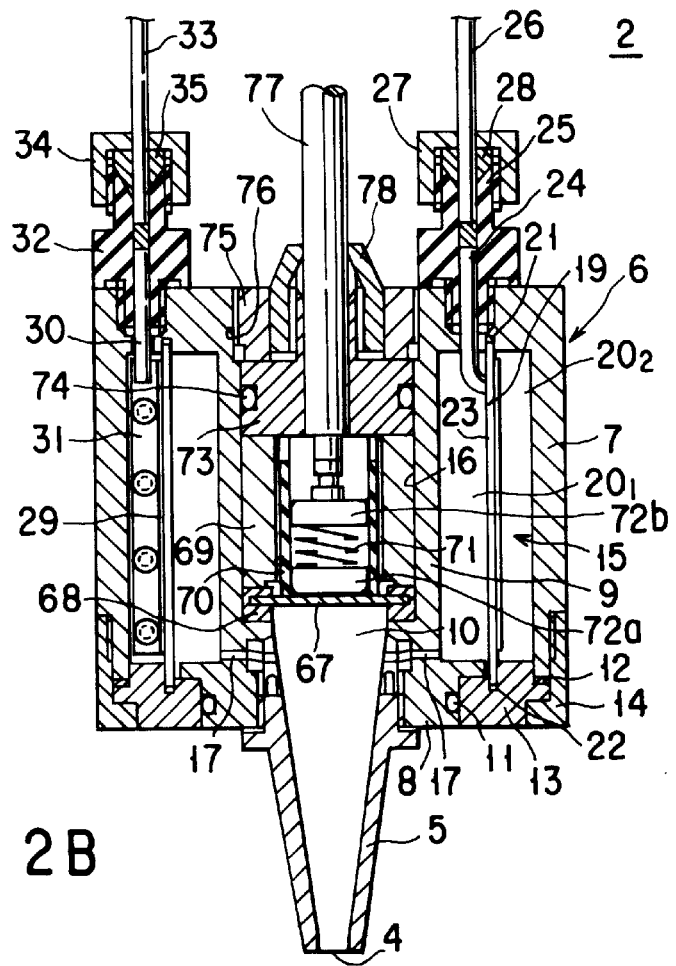
FIG. 2B is a sectional view taken along a line B—B in FIG. 2A.
Figure 5A:
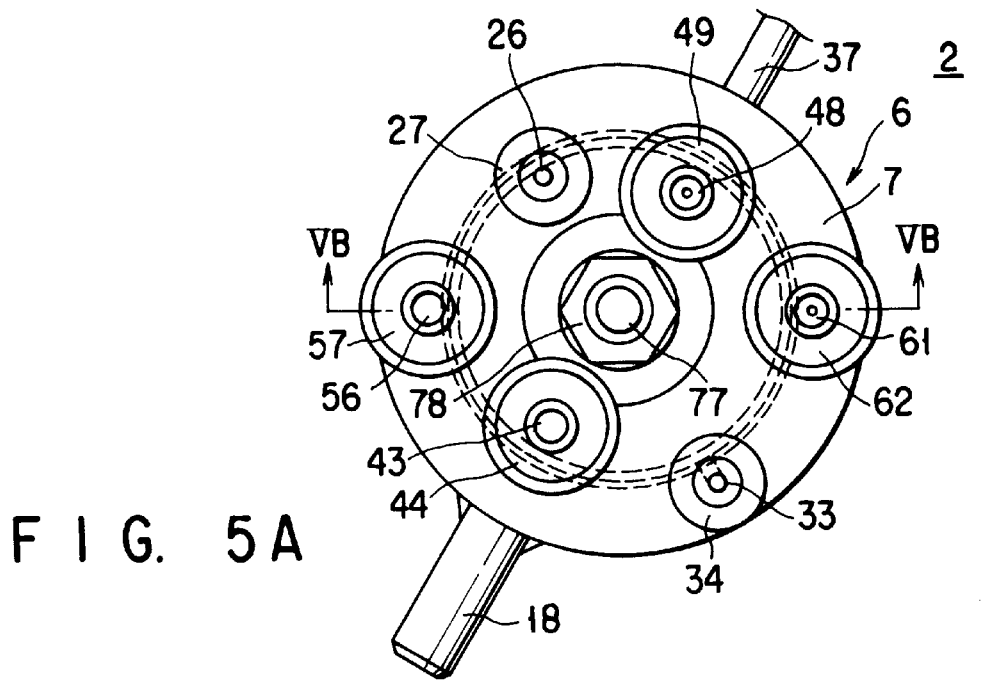
FIG. 5A is a top view showing the cylindrical cleaning solution spray in FIG. 1.
Figure 5B:
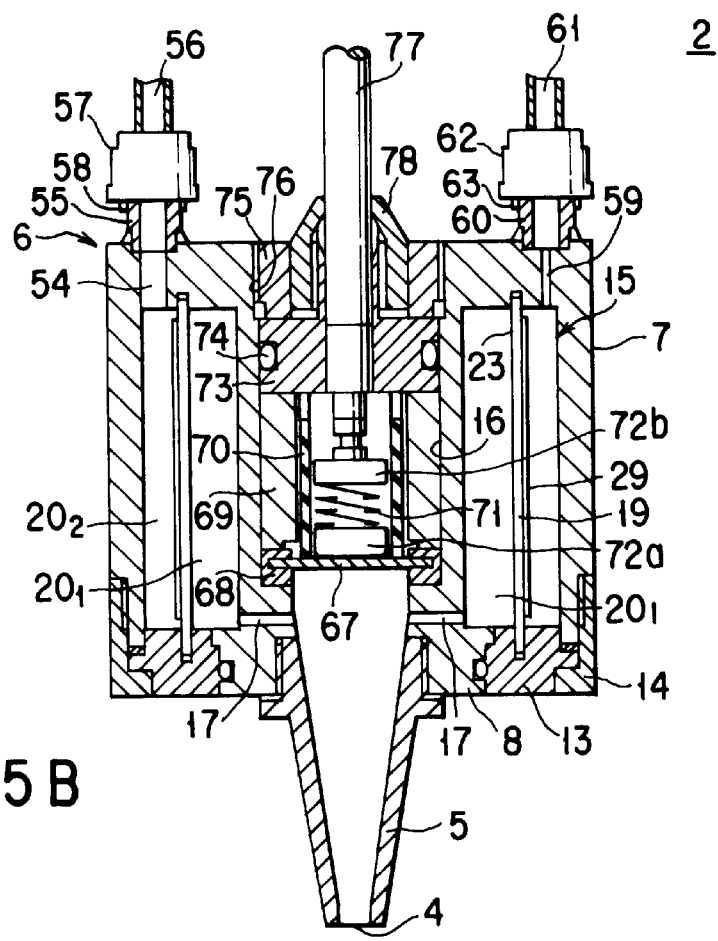
FIG. 5B is a sectional view taken along a line B—B in FIG. 5A.
Figure 6:
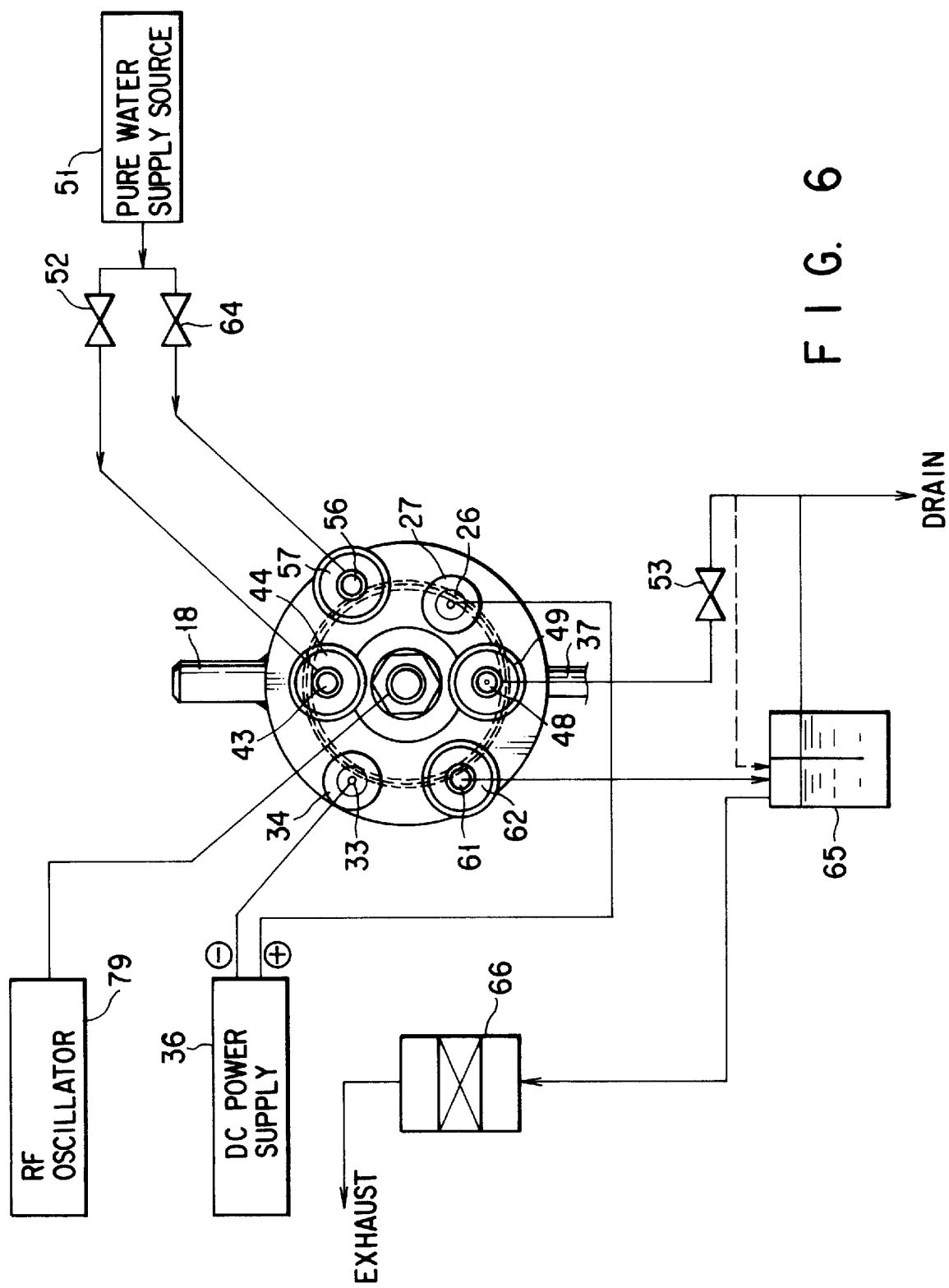
FIG. 6 is a schematic view showing the cleaning solution spray in FIG. 1 and its peripherals.

FIG. 1 is a perspective view showing the cleaning apparatus. FIG. 2A is a top view of a cylindrical cleaning solution spray in FIG. 1. FIG. 2B is a sectional view of the cylindrical cleaning solution spray taken along a line B—B (along a power feed unit) in FIG. 2A. FIG. 3 is an exploded view of the cleaning solution spray in FIG. 2B. FIG. 4A is a top view of the cylindrical cleaning solution spray in FIG. 1. FIG. 4B is a sectional view of the cylindrical cleaning solution spray taken along a line B—B (along a unit for supplying water to an outside processing chamber) in FIG. 4A. FIG. 4C is a sectional view taken along a line C—C in FIG. 4B. FIG. 5A is a top view of the cylindrical cleaning solution spray in FIG. 1. FIG. 5B is a sectional view of the cylindrical cleaning solution spray taken along a line B—B (along a unit for supplying water to an inside processing chamber) in FIG. 5A. FIG. 6 is a schematic view showing the cleaning solution spray in FIG. 1 and its peripherals.

The edge, for example, of a substrate to be cleaned (e.g., a semiconductor wafer) 1 is held by a substrate holding member (not shown). A cylindrical cleaning solution spray 2 sprays a cleaning solution 3 upon the semiconductor wafer 1. The cleaning solution spray 2 is moved in the X and Y directions by a moving mechanism (not shown) connected to a handler 18 extending from the circumferential surface of the spray 2.

The cylindrical cleaning solution spray 2 includes a cylindrical main body 6 having a nozzle 5 in the lower end of which a cleaning solution discharge port 4 is open. This main body 6 includes an upper-end-sealing cylinder 7, a lower-end-sealing cylinder (partition) 9, a nozzle hole 10, a fixing ring 13, and an annular nut 14. The lower-end-sealing cylinder 9 is concentrically arranged in the upper-end-sealing cylinder 7 and has an annular flange 8 in the lower end. The nozzle hole 10 extends through a lower-end-sealing portion of the partition 9. The fixing ring 13 engages with the lower end of the cylinder 7 via an annular packing 11 and with the outer circumferential surface of the flange 8 via an O-ring 12. The annular nut 14 threadably engages with the outer circumferential surface of the lower end of the cylinder 7 and fixes the lid 13 to the cylinder 7 and the partition 9.

The nozzle 5 threadably engages with the inner circumferential surface of the flange 8 of the partition 9 and communicates with the nozzle hole 10. A first cylindrical space 15 is formed between the cylindrical partition 9 and the inner surface of the cylinder 7. A second space 16 is formed inside the partition 9 to communicate with the nozzle 5 through the nozzle hole 10. An ultrasonic wave generating member described later is arranged in the second space 16. As shown in FIG. 4C, a plurality of cleaning solution passages 17 are formed in the lower-end-sealing portion of the cylindrical partition 9 and communicate with the first and second spaces 15 and 16.

A cylindrical $H^+$ ion exchange membrane 19 is arranged in the first space 15 of the cylindrical main body 6 to be concentrical with the cylindrical partition 9. This partition 9 divides the first space 15 into a cylindrical inside processing chamber $20_1$ and a cylindrical outside processing chamber $20_2$. The upper end of the $H^+$ ion exchange membrane 19 is fitted in the upper-end-sealing portion of the cylinder 7 via an annular packing 21. The lower end of the $H^+$ ion exchange membrane 19 is fitted in the fixing ring 13 via an annular packing 22.

As shown in FIGS. 2A, 2B, and 3, a cylindrical inside electrode 23 made of a porous plate in which a large number of pores are formed is fixed to the surface of the $H^+$ ion exchange membrane 19 on the side of the inside processing chamber $20_1$. This inside electrode 23 is made of a material such as platinum-platinum oxide or platinum-plated titanium or tantalum. A head of an inside internal terminal 24 coated with an insulating tube is connected to the inside electrode 23. This inside internal terminal 24 extends to the outside through the upper-end-sealing portion of the cylinder 7. The inside internal terminal 24 is inserted into a cable fitting member 25 made of an insulating material. The cable fitting member 25 threadably engages with the upper-end-sealing portion of the cylinder 7 from which the inside internal terminal 24 extends. An inside external cable 26 coated with an insulating tube is inserted into the cable fitting member 25, and a core at the end of the inside external cable 26 is connected to the inside internal terminal 24. A cap 27 threadably engages with the upper portion of the cable fitting member 25. The inside external cable 26 is fixed in the cable fitting member 25 by pressing a wedge 28 fitted on the inside external cable 26.

As shown in FIGS. 2A, 2B, and 3, a cylindrical outside electrode 29 made of a porous plate in which a large number of pores are formed is fixed to the surface of the $H^+$ ion exchange membrane 19 on the side of the outside processing chamber $20_2$. This outside electrode 29 is made of a material such as platinum-platinum oxide or platinum-plated titanium or tantalum. A head of an outside internal terminal 30 coated with an insulating tube is connected to the outside electrode 29 via a band terminal plate 31 connected in the direction of height of the outside electrode 29. This outside internal terminal 30 extends to the outside through the upper-end-sealing portion of the cylinder 7. The outside internal terminal 30 is inserted into a cable fitting member 32 made of an insulating material. The cable fitting member 32 threadably engages with the upper-end-sealing portion of the cylinder 7 from which the internal terminal 30 extends. An outside external cable 33 coated with an insulating tube is inserted into the cable fitting member 32, and a core at the end of the outside external cable 33 is connected to the outside internal terminal 30. A cap 34 threadably engages with the upper portion of the cable fitting member 32. The outside external cable 33 is fixed in the cable fitting member 32 by pressing a wedge 35 fitted on the outside external cable 33.

As shown in FIG. 6, the inside and outside external cables 26 and 33 are connected to a DC power supply 36. An electrolytic processing water discharge pipe 37 is connected to a lower portion of the circumferential surface of the cylinder 7 and discharges the processing water in the outside processing chamber $20_2$ to the outside.

The $H^+$ ion exchange membrane 19, the inside processing chamber $20_1$, the inside electrode 23, the outside processing chamber $20_2$, the outside electrode 29, and the DC power supply 36 constitute an electrolytic ion generating member.

As shown in FIGS. 4A to 4C, an inside pure water supply nozzle 39 in which a plurality of eject holes 38 are formed in the lengthwise direction is inserted into a rib 40 formed on the outer circumferential wall of the cylindrical partition 9. Pure water outlets 41 are open in the rib 40 to oppose the eject holes 38. That is, pure water supplied from the inside pure water supply nozzle 39 is introduced into the inside processing chamber $20_1$ of the cylindrical main body 6 through the eject holes 38 and the pure water outlets 41. The inside pure water supply nozzle 39 extends through the upper-end-sealing portion of the cylinder 7 and is inserted into a pipe fitting member 42 which is inserted into the upper-end-sealing portion. An inside pure water supply pipe 43 is connected to the nozzle 39 in the pipe fitting member 42 and fixed by a cap 44 threadably engaging with the fitting member 42 and a spring pipe 45 inserted between the cap 44 and the supply pipe 43.

An inside vent hole 46 vertically extends through the central portion of the cylinder 7 from the insertion position of the inside pure water supply pipe 43 and the upper-end-sealing portion of the cylinder 7 on the opposite side. A pipe fitting member 47 is inserted into the upper-end-sealing portion of the cylinder 7 so as to communicate with the vent hole 46. An inside venting pipe 48 is inserted into the pipe fitting member 47 and fixed by a cap 49 threadably engaging with the fitting member 47 and a spring pipe 50 inserted between the cap 49 and the venting pipe 48.

As shown in FIG. 6, pure water is supplied from a pure water supply source 51 to the inside pure water supply pipe 43, and an inside pure water flow rate control valve 52 is inserted in the middle of the inside pure water supply pipe 43. A flow rate control valve 53 is inserted in the middle of the venting pipe 48. Since the flow rate control valves 52 and 53 are thus inserted midway along the inside pure water supply pipe 43 and the venting pipe 48, the amount of electrolytic processing solution (cleaning solution) discharged together with the gas from the venting pipe 48 can be suppressed by controlling the pressure balance in the inside processing chamber $20_1$ by regulating the openings of these valves. When OH$^-$ ions are generated in the inside processing chamber $20_1$ by electrolytic processing, the gas discharged together with the electrolytic processing solution from the venting pipe 48 is primarily oxygen. Therefore, the gas is directly discharged without any gas discharge processing.

As shown in FIGS. 5A and 5B, an outside pure water supply hole 54 vertically extends through the upper-end-sealing portion of the cylinder 7. A pipe fitting member 55 is inserted into the upper-end-sealing portion of the cylinder 7 so as to communicate with this supply hole 54. An outside pure water supply pipe 56 is inserted into the pipe fitting member 55 and fixed by a cap 57 threadably engaging with the fitting member 55 and a spring pipe 58 inserted between the cap 57 and the supply pipe 56.

An outside vent hole 59 vertically extends through the central portion of the cylinder 7 from the insertion position of the outside pure water supply pipe 56 and the upper-end-sealing portion of the cylinder 7 on the opposite side. A pipe fitting member 60 is inserted into the upper-end-sealing portion of the cylinder 7 so as to communicate with the vent hole 59. An outside venting pipe 61 is inserted into the pipe fitting member 60 and fixed by a cap 62 threadably engaging with the fitting member 60 and a spring pipe 63 inserted between the cap 62 and the venting pipe 61.

As shown in FIG. 6, pure water is supplied from the pure water supply source 51 to the outside pure water supply pipe 56, and an outside pure water flow rate control valve 64 is inserted in the middle of the outside pure water supply pipe 56. The outside venting pipe 61 is connected to a gas-liquid separator 65. This gas-liquid separator 65 is connected to a processing tower 66 containing a hydrogen gas processing catalyst.

The inside venting pipe 48 is connected to the gas-liquid separator 65 as indicated by the broken line in FIG. 6 when the state shown in FIG. 6, i.e., the state in which the positive and negative terminals of of the DC power supply 36 are connected to the inside and outside electrodes 23 and 29, respectively (in this state H$^+$ ions are generated in the inside processing chamber $20_1$ and OH$^-$ ions are generated in the outside processing chamber $20_2$), is switched to a state in which the positive and negative electrodes are connected to the outside and inside electrodes 29 and 23, respectively (in this state OH$^-$ ions are generated in the inside processing chamber $20_1$ and H$^+$ ions are generated in the outside processing chamber $20_2$). On the other hand, the gas discharged together with the electrolytic processing solution from the outside venting pipe 61 is primarily oxygen. Therefore, this gas is directly discharged without any gas discharge processing.

An annular holding member 68 holding a disk-like vibrator 67 engages with the partition 9 on the inner bottom portion of the second space 16 in the cylindrical main body 6. A cylindrical protective member 69 and an insulating guide cylinder 70 are arranged on the annular holding member 68 and the vibrator 67, respectively, in the second space 16. Two disk-like power-supply terminals 72a and 72b between which a spring 71 is interposed are arranged in the insulating guide cylinder 70. A disk-like guide 73 is arranged on the cylindrical protective member 69 in the second space 16 via an O-ring 74. An annular lid 75 threadably engages with an opening 76 in the center of the upper-end-sealing portion of the cylinder 7. The end portion of a power-supply cable 77 is connected to the power-supply terminal 72b in the upper portion through the annular lid 75 and the disk-like guide 73. The power-supply cable 77 is fixed by a cylindrical fitting member 78 threadably engaging with the annular lid 75. The vibrator 67, the power-supply terminals 72a and 72b, and the power-supply cable 77 make up an ultrasonic wave generating member. Also, the power-supply cable 77 is connected to an RF oscillator 79 as shown in FIG. 6.

A method by which the cleaning apparatus shown in FIGS. 1 to 6 cleans a substrate to be cleaned will be described below.

1-1) First, as shown in FIG. 1, the end portion of the substrate to be cleaned (e.g., a semiconductor wafer) 1 is held by the substrate holding member (not shown).

1-2) As shown in FIGS. 4A to 4C and 6, the pure water supply source 51 supplies pure water to the pure water supply nozzle 39 inserted into the partition 9 of the cylindrical main body 6 through the inside pure water supply pipe 43. This pure water is introduced into the inside processing chamber $20_1$ partitioned by the cylindrical H$^+$ ion exchange membrane 19 and the partition 9 through the eject holes 38 of the pure water supply nozzle 39 and the pure water outlets 41 open in the partition 9. The pure water flows down in the inside processing chamber $20_1$ along the cylindrical inside electrode 23 fixed to the cylindrical ion exchange membrane 19 and flows out into the nozzle hole 10 in the center of the partition 9 through the cleaning solution passages 17 formed in the partition 9.

Simultaneously, as shown in FIGS. 5A, 5B, and 6, the pure water supply source 51 supplies pure water to the outside pure water supply pipe 56. This pure water is introduced into the outside processing chamber $20_2$ partitioned by the cylindrical H$^+$ ion exchange membrane 19 and the cylinder 7 through the outside pure water supply hole 54 open in the upper-end-sealing portion of the cylindrical main body 6 so as to communicate with the pure water supply pipe 56. The pure water flows down in the outside processing chamber $20_2$ along the cylindrical outside electrode 29 fixed to the cylindrical ion exchange membrane 19 and is discharged to the outside from the electrolytic processing water discharge pipe 37 connected to the lower portion of the cylindrical main body 6.

1-3) While the pure water is thus supplied to the inside processing chamber $20_1$ and the outside processing chamber $20_2$, as shown in FIG. 6, the positive terminal of the DC power supply 36 is connected to the inside electrode 23 fixed to the surface of the H$^+$ ion exchange membrane 19 on the side of the inside processing chamber $20_1$ through the inside external cable 26 and the inside internal terminal 24. On the other hand, the negative terminal is connected to the outside electrode 29 fixed to the surface of the H$^+$ ion exchange membrane 19 on the side of the outside processing chamber $20_2$ through the outside internal terminal 30 and the band terminal plate 31. Predetermined voltage and current are supplied to the electrodes 23 and 29 thus connected. Consequently, an electrolytic reaction, $2H_2O-4e^- \rightarrow O_2 + 4H^+$, occurs on the positive electrode (inside electrode) 23, and H$^+$ is produced in the inside processing chamber $20_1$. This H$^+$-rich solution flows out from the inside processing chamber $20_1$ into the nozzle hole 10 in the center of the partition 9 through the cleaning solution passages 17 formed in the partition 9. The solution passes through the nozzle 5 communicating with the nozzle hole 10 and is sprayed from the circular discharge port 4 at the lower end of the nozzle 5.

Note that an OH⁻-rich solution is produced in the outside processing chamber $20_2$ and discharged to the outside from the electrolytic processing water discharge pipe 37 as described earlier.

When the electrolytic processing of the pure water is performed in the cylindrical main body 6, oxygen gas ($O_2$) produced together with H⁺ in the inside processing chamber $20_1$ is released. As shown in FIG. 4B, this oxygen gas released in the inside processing chamber $20_1$ is discharged, together with the H⁺-rich solution, to the outside through the inside vent hole 46 open in the upper-end-sealing portion of the cylinder 7, the pipe fitting member 47, and the inside venting pipe 48. As shown in FIG. 6, the discharge of the gas and the H⁺-rich solution (cleaning solution) from the venting pipe 48 can be suppressed by controlling the pressure balance in the inside processing chamber $20_1$ by regulating the openings of the flow rate control valves 52 and 53 inserted midway along the inside pure water supply pipes 43 and the venting pipe 48.

Furthermore, when the electrolytic processing of the pure water is performed in the cylindrical main body 6, hydrogen gas ($H_2$) produced together with OH⁻ in the outside processing chamber $20_2$ is released. As shown in FIG. 5B, this hydrogen gas released in the outside processing chamber $20_2$ is discharged together with the OH⁻-rich solution through the outside vent hole 59 open in the upper-end-sealing portion of the cylinder 7, the pipe fitting member 60, and the outside venting pipe 61. Since this discharged solution contains hydrogen and is dangerous, the solution is discharged to the gas-liquid separator 65 as shown in FIG. 6. Hydrogen separated by the gas-liquid separator is removed through the processing tower 66 containing a hydrogen gas processing catalyst and vented in a safe condition.

1-4) After the production of the H⁺-rich solution in the inside processing chamber $20_1$ stabilizes, the cylindrical cleaning solution spray 2 is moved to a position above the semiconductor wafer 1, as shown in FIG. 1, by the moving mechanism (not shown) connected to the handler 18. At the same time, the H⁺-rich solution (cleaning solution) is sprayed upon the semiconductor wafer 1 from the discharge port 4 in the nozzle 5 of the cleaning solution spray 2 while the spray 2 is moved in the X and Y directions, thereby performing acid cleaning (equivalent to SC-2 cleaning) over the entire surface of the semiconductor wafer 1.

Cleaning performed by switching the connections between the DC power supply 36 and the inside and outside electrodes 23 and 29 will be described next.

2-1) While pure water is supplied to the inside and outside processing chambers $20_1$ and $20_2$ as in steps 1-1) and 1-2) described above, the negative terminal of the DC power supply 36 is connected to the inside electrode 23 fixed to the surface of the H⁺ ion exchange membrane 19 on the side of the inside processing chamber $20_1$. On the other hand, the positive terminal is connected to the outside electrode 29 fixed to the surface of the H⁺ ion exchange membrane 19 on the side of the outside processing chamber $20_2$. Predetermined voltage and current are applied to the electrodes 23 and 29 thus connected. Consequently, an electrolytic reaction, $2H_2O+2e^-\rightarrow H_2+2OH^-$, takes place on the negative electrode (inside electrode) 23, and OH⁻ is produced in the inside processing chamber $20_1$. As shown in FIG. 4B, this OH⁻-rich solution flows out from the inside processing chamber $20_1$ into the nozzle hole 10 in the center of the partition 9 through the cleaning solution passages 17 formed in the partition 9. The solution passes through the nozzle 5 communicating with the nozzle hole 10 and is sprayed from the circular discharge port 4 at the lower end of the nozzle 5.

Note that an H⁺-rich solution is produced in the outside processing chamber $20_2$ and discharged to the outside from the electrolytic processing solution discharge pipe 37 as described previously. Also, when the pure water electrolytic processing is performed in the cylindrical main body 6, hydrogen gas is additionally produced in the inside processing chamber $20_1$. This hydrogen gas passes through the inside vent hole 46, the pipe fitting member 47, the inside venting pipe 48, and the piping system indicated by the broken line in FIG. 6 and is vented in a safe condition via the gas-liquid separator 65 and the processing tower 66. Furthermore, oxygen gas additionally produced in the outside processing chamber $20_2$ is discharged together with the H⁺-rich solution through the outside vent hole 59, the pipe fitting member 60, and the outside venting pipe 61.

2-2) After the production of the OH⁻-rich solution in the inside processing chamber $20_1$ stabilizes, the cylindrical cleaning solution spray 2 is moved to a position above the semiconductor wafer 1, as shown in FIG. 1, by the moving mechanism (not shown) connected to the handler 18. Simultaneously, the OH⁻-rich solution (cleaning solution) is sprayed upon the semiconductor wafer 1 from the discharge port 4 in the nozzle 5 of the cleaning solution spray 2 while the spray 2 is moved in the X and Y directions, thereby performing alkali cleaning (equivalent to SC-1 cleaning) over the entire surface of the semiconductor wafer 1. Unlike conventional cleaning using a chemical solution, pure water is used in this alkali cleaning. Therefore, the etching action on the semiconductor wafer 1 is extremely weak. Consequently, it is possible to prevent the generation of Crystal Originated Particles (COPs) on the wafer 1.

In the acid cleaning and the alkali cleaning described above, the relationship between the voltage and the current applied to the inside and outside electrodes 23 and 29 is defined by the distance between the electrodes, the electrode areas, and the characteristic values and the thickness of the H⁺ ion exchange membrane. Accordingly, the ranges of these numeric values cannot be specified. However, when the efficiency of the electrolytic reaction and the safety in operation are taken into consideration, it is preferable to set ranges of 10V to a few tens of V and 0.05 to 0.5 A/cm².

In the cleaning method according to the present invention as described above, a cleaning solution such as the H⁺-rich solution (or the OH⁻-rich solution) produced in the inside processing chamber $20_1$ of the cylindrical cleaning solution spray 2 can be rapidly sprayed, with no time delay, upon the semiconductor wafer 1 from the discharge port 4 of the nozzle 5. That is, the cleaning solution containing H⁺ ions can be immediately sprayed upon the semiconductor wafer 1. Consequently, acid cleaning (or alkali cleaning) can be well performed for the semiconductor wafer 1.

Also, acid cleaning or alkali cleaning can be easily selected by switching the polarities to the inside and outside electrodes 23 and 29 by the DC power supply 36. Additionally, the consumption amount of pure water can be decreased compared to electrolytic processing in a common processing bath.

Furthermore, as shown in FIGS. 3 and 4A to 4C, the H⁺ ion exchange membrane 19 is concentrically arranged in the cylindrical main body 6, and the cylindrical inside and outside electrodes 23 and 29 are arranged on the two sides of the H⁺ ion exchange membrane 19. Therefore, when an electrolytic reaction occurs in the cylindrical main body 6, this electrolytic reaction efficiently progresses in the inside and outside processing chambers $20_1$ and $20_2$, and a solution extremely rich in H⁺ (or a solution extremely rich in OH⁻) is produced in the inside processing chamber $20_1$. As a consequence, the detergency to the semiconductor wafer 1 can be further increased.

Moreover, since the inside and outside electrodes 23 and 29 (particularly the inside electrode 23) arranged (fixed) on the two sides of the H⁺ ion exchange membrane 19 are made from a cylindrical porous plate, the electrolytic reaction of pure water readily takes place. This further improves the production efficiency of H⁺ (or OH⁻). It is preferable to arrange pores about 2 to 3 mm in diameter at a pitch of 2 to 3 mm in this cylindrical porous plate.

A method of performing cleaning by driving the ultrasonic wave generating member incorporated into the cylindrical main body 6 of the cleaning solution spray 2 will be described below.

Following steps 1-1) to 1-3) described previously, an H⁺-rich solution is produced in the inside processing chamber $20_1$ of the cylindrical main body 6. As shown in FIGS. 4A to 4C, this solution is made to flow out from the inside processing chamber $20_1$ into the nozzle hole 10 in the center of the partition 9 through the cleaning solution passages 17 formed in the partition 9. Simultaneously, the RF oscillator 79 supplies a radio frequency to the disk-like vibrator 67 immediately above the nozzle hole 10 through the power-supply cable 77 and the two disk-like power-supply terminals 72a and 72b between which the spring 71 is interposed. With the supply of this radio frequency, the vibrator 67 vibrates at a frequency of, e.g., 500 kHz to 3 MHz, and ultrasonic waves act on the H⁺-rich solution in the nozzle hole 10. As shown in FIG. 1, the H⁺-rich solution (cleaning solution) 3 under the influence of the ultrasonic waves is sprayed upon the semiconductor wafer 1 from the discharge port 4 of the nozzle 5. Consequently, any particles on the surface of the wafer 1 can also be well removed. It is also possible to obtain a new effect in addition to the removal of particles.

That is, the H⁺-rich solution introduced from the inside processing chamber $20_1$ into the nozzle hole 10 through the cleaning solution passages 17 is made radical and activated by the ultrasonic waves generated by the vibrator 67. This activated state of the H⁺-rich solution (cleaning solution) is maintained nearly the same while the activated H⁺-rich solution is sprayed upon the surface of the semiconductor wafer 1 from the discharge port 4 of the nozzle 5 in the lower portion of the cylindrical main body 6. Therefore, a strong acid detergency can be made to act upon the semiconductor wafer 1 by the interaction between the H⁺-rich solution and the radicals contained in the solution. Consequently, precise cleaning can be performed by the combination of this action and the removal of particles from the surface of the wafer 1 described above.

Additionally, the connections between the DC power supply 36 and the inside and outside electrodes 23 and 29 are switched. That is, an OH⁻-rich solution is produced in the inside processing chamber $20_1$ by connecting the negative and positive terminals of the DC power supply 36 to the inside and outside electrodes 23 and 29, respectively. This OH⁻-rich solution is introduced from the inside processing chamber $20_1$ into the nozzle hole 10 through the cleaning solution passages 17, acted upon by the ultrasonic waves generated by the vibrator 67, and sprayed upon the surface of the semiconductor wafer 1 from the discharge port 4 of the nozzle 5 in the lower portion of the cylindrical main body 6. With this spraying, a strong alkali detergency can be made to act upon the semiconductor wafer 1 by the interaction between the OH⁻-rich solution and the radicals contained in the solution. As a consequence, precise cleaning can be performed by the combination of this action and the removal of particles from the surface of the wafer 1 described above.

Another cleaning apparatus according to the present invention will be described below with reference to FIG. 7.

Figure 7:
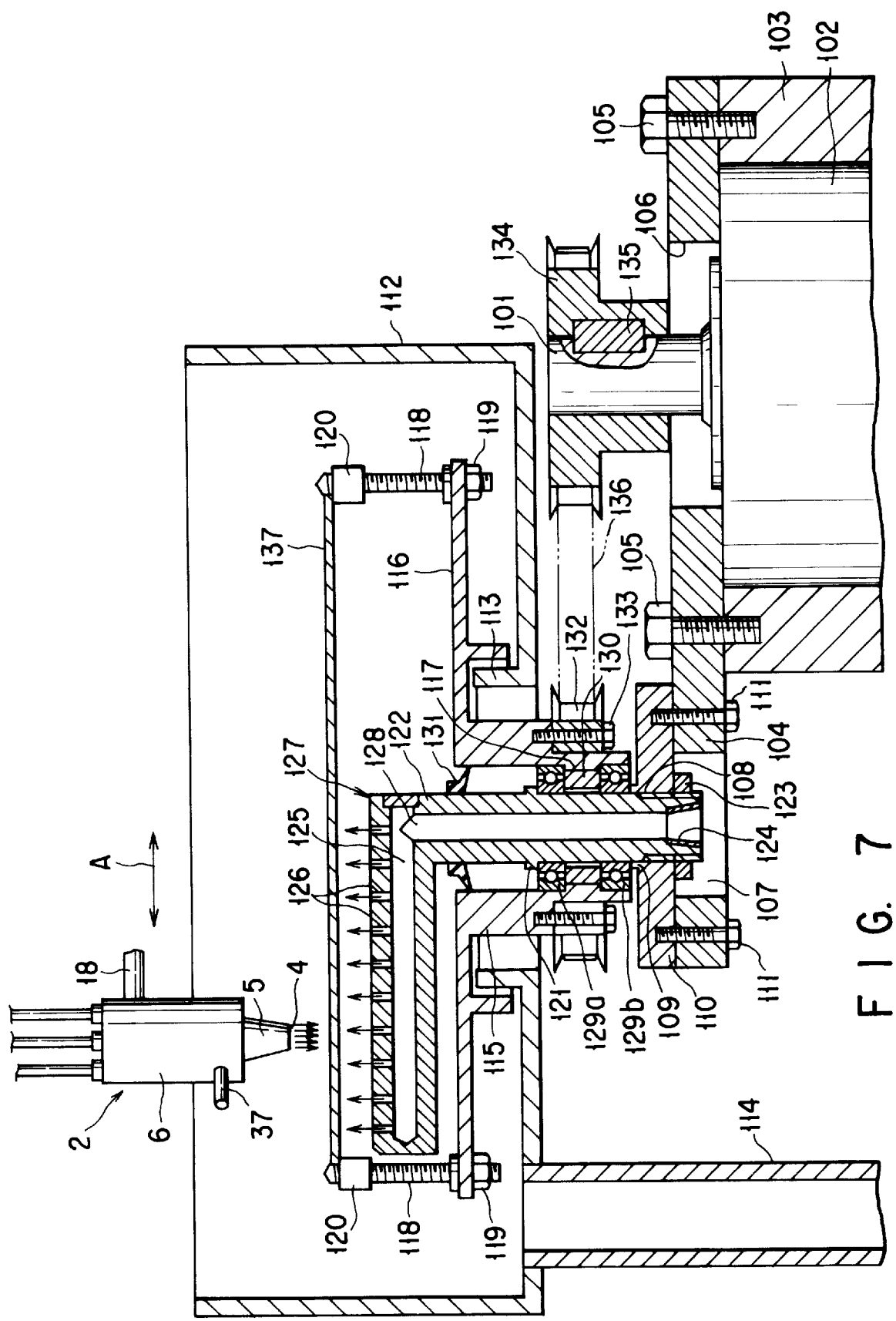
FIG. 7 is a sectional view showing another cleaning apparatus according to the present invention.

FIG. 7 is a sectional view showing another cleaning apparatus according to the present invention. A motor 102 whose driving shaft 101 vertically extends is housed in a cylindrical support member 103. A support plate 104 is fixed on the cylindrical support member 103 by a plurality of screws 105. A hole 106 is formed in a portion of the support plate 104 corresponding to the driving shaft 101. A hole 107 is formed in a portion of the support plate 104 extending to the left from the support member 103. A disk plate 110 has a hole 108 in the center and an annular projection 109 around the hole 108 and is fixed on the support plate 104 by a plurality of screws 111 threadably engaging from the lower surface of the support plate 104 toward the plate 109.

A processing bath 112 is arranged above the disk plate 110. The processing bath 112 is a closed-end cylindrical member and has a cylindrical portion 113 projecting upward from the center of the bottom. A discharge pipe 114 is connected to a portion of the bottom close to a wall on the left side of the processing bath 112. Note that the processing bath 112 is supported and fixed by a frame (not shown) so that the cylindrical portion 113 is positioned concentrically with the hole 108 in the disk plate 110.

A rotary disk 116 having a cylinder 115 projecting downward from a central portion is horizontally arranged in the processing bath 112. Since the rotary disk 116 is thus arranged, the cylinder 115 concentrically passes through the cylindrical portion 113 of the processing bath 112 and extends to the outside of the processing bath 112. An annular engaging portion 117 horizontally extends from the inner circumferential surface near a lower portion of the cylinder 115. Four support rods 118 having threaded upper and lower portions are inserted into the edge of the rotary disk 116 so as to vertically extend at equal peripheral angles (90°). These support rods 118 are fixed to the rotary disk 116 by threadably engaging nuts 119 with the lower threaded portions of the support rods 118 projecting from the lower surface of the rotary disk 116. Columnar support blocks 120 threadably engage with the upper threaded portions of the support rods 118 so as to be positioned on the same level.

A cylindrical fixed shaft 122 having an annular flange 121 near a middle portion and a threaded outer circumferential surface in a lower portion concentrically extends from the processing bath 112 through the cylinder 115 of the rotary disk 116 and inserted into the hole 108 of the disk plate 110. This fixed shaft 122 projects downward from the lower surface of the plate 110 and fixed to the plate 110 by threadably engaging a nut 123 with this projected portion. A joint portion 124 for a cleaning solution supply pipe is formed in the lower-end opening of the fixed shaft 122. A cleaning solution supply pipe (not shown) is connected to this joint portion 124. A cleaning solution passage 125 is formed inside a horizontally extending shower nozzle (second cleaning solution spray means) 127. A plurality of spray holes 126 communicating with this passage 125 are open in the upper portion of the shower nozzle 127. The shower nozzle 127 is positioned in a space surrounded by the four support rods 118 inserted into and fixed to the edge of the rotary disk 116, and is formed integrally with the end portion of the fixed shaft 122 so that a hollow portion 128 and the passage 125 communicate with each other. Two bearings 129a and 129b are arranged in a space partitioned by the inner surface of the cylinder 115, the outer circumferential surface of the fixed shaft 122, the annular flange 121 of the fixed shaft 122, and the annular projection 109 of the plate 110. These bearings 129a and 129b are vertically arranged with a desired spacing between them via an annular spacer 130. The lower surface of the upper bearing 129a engages with the upper surface of the annular engaging portion 117 formed on the inner circumferential surface near the lower portion of the cylinder 115. The upper surface of the lower bearing 129b engages with the lower surface of the annular engaging portion 117. A rubber V-ring 131 is interposed between the upper inner circumferential surface of the cylinder 115 of the rotary disk 116 and the fixed shaft 122. This V-ring 131 prevents the cleaning solution from the shower nozzle (to be described later) from flowing between the inner circumferential surface of the cylinder 115 and the fixed shaft 122.

A timing pulley 132 to be driven is fitted on the lower outer circumference of the cylinder 115 and fixed to the cylinder 115 by a plurality of screws 133. A driving timing pulley 134 is fitted on the driving shaft 101 of the motor 102 and fixed to the driving shaft 101 by a locking member 135 attached between them. A timing belt 136 is looped between the timing pulleys 132 and 134. Accordingly, when the driving shaft 101 of the motor 102 is rotated to rotate the driving timing pulley 134 fixed to the driving shaft 101, the rotating force is transmitted to the timing pulley 132 to be driven via the timing belt 136. Consequently, the rotary disk 116 having the cylinder 115 to which the timing pulley 132 is attached rotates about the fixed shaft 122.

The driving shaft 101, the motor 102, the rotary disk 116, the support rods 118, the support blocks 120, the fixed shaft 122, the bearings 129a and 129b, the timing pulleys 132 and 134, and the timing belt 136 constitute a rotating means.

A cylindrical cleaning solution spray (first cleaning solution spray means) 2 has the structure shown in FIGS. 1 to 6. The cylindrical cleaning solution spray 2 is arranged above the rotary disk 116 and moves back and forth as indicated by an arrow A within a range equivalent to the radius of the rotary disk 116.

A method by which the cleaning apparatus of the present invention cleans a substrate to be cleaned (e.g., a semiconductor wafer) will be described below.

3-1) First, a substrate to be cleaned (e.g., a semiconductor wafer) 137 is horizontally placed on the support blocks 120 attached to the four support rods 118 of the rotary disk 116. The motor 102 is driven to rotate the driving shaft 101, rotating the driving timing pulley 134 fixed to the driving shaft 101. The driving force is transmitted to the timing pulley 132 to be driven via the timing belt 136, and the rotary disk 116 having the cylinder 115 to which the timing pulley 132 is attached rotates about the fixed shaft 122. Consequently, the semiconductor wafer 137 placed on the support blocks 120 at the upper ends of the four support rods 118 inserted into and fixed to the rotary disk 116 rotates. While the semiconductor wafer 137 is thus rotated, a cleaning solution, e.g., pure water, is supplied to the cleaning solution supply pipe (not shown) connected to the joint portion 124 of the cylindrical fixed shaft 122. This pure water passes through the hollow portion 128 of the fixed shaft 122, introduced to the passage 125 of the shower nozzle 127 communicating with the hollow portion 128, and is sprayed upward from the spray holes 126 in the upper portion of the nozzle 127. The shower nozzle 27 is positioned in the space surrounded by the four support rods 118 inserted into and fixed to the edge of the rotary disk 116. Therefore, the pure water from the shower nozzle 127 is sprayed upon the lower surface of the rotating semiconductor wafer 137 while being placed on the support blocks 120 of the support rods 118.

3-2) In the cylindrical cleaning solution spray 2, an $H^+$-solution is produced in an inside processing chamber $20_1$ in a cylindrical main body 6 following steps 1-2) and 1-3) described earlier. The resultant solution is made to flow from the inside processing chamber $20_1$ into a nozzle hole 10 in the center of a partition 9 through a plurality of cleaning solution passages 17 formed in the partition 9. At the same time, an RF oscillator 79 supplies a radio frequency of, e.g., 500 kHz to 3 MHz to a disk-like vibrator 67 immediately above the nozzle hole 10. The vibrator 67 vibrates and makes ultrasonic waves act on the $H^+$-rich solution in the nozzle hole 10, thereby producing radicals in the $H^+$-rich solution. This solution is carried on the ultrasonic waves and sprayed upon the surface of the rotating semiconductor wafer 137 from a discharge port 4 of a nozzle 5 in the lower portion of the cylindrical main body 6. Also, the ultrasonic waves pass through the semiconductor wafer 137. At the same time, the cylindrical cleaning solution spray 2 is moved back and forth as indicated by the arrow A within the range corresponding to the radius of the rotary disk 116, i.e., the radius of the semiconductor wafer 137. Consequently, the cleaning solution carried on the ultrasonic waves is sprayed upon the entire surface of the semiconductor wafer 137 from the circular discharge port 4 of the nozzle 5. The pure water sprayed from the cylindrical cleaning solution spray 2 and the shower nozzle 127 to clean the upper and lower surfaces of the semiconductor wafer 137 is collected in the cleaning bath 112 and discharged to the outside from the discharge pipe 114.

As described above, while the semiconductor wafer 137 is horizontally placed and rotated by the rotating means, the cleaning solution spray 2 is moved back and forth to spray the $H^+$-rich solution (cleaning solution) carried on ultrasonic waves and containing active radicals upon the entire surface of the semiconductor wafer 137. Consequently, acid cleaning (equivalent to SC-2 cleaning) can be performed with a strong detergency on the entire surface of the semiconductor wafer 137. Simultaneously, any particles on the surface of the wafer 137 can be washed away together with the cleaning solution and prevented from again sticking to the wafer surface. In this way, the wafer 137 can be precisely cleaned.

The cleaning solution carried on ultrasonic waves is sprayed from the cleaning solution spray 2 upon the surface of the semiconductor wafer 137 and swept in the direction of the arrow A. Simultaneously, pure water is sprayed upon the lower surface of the semiconductor wafer 137 from the shower nozzle 127 arranged below the semiconductor wafer 137. The ultrasonic waves from the cleaning solution spray 2 travel through the semiconductor wafer 137 and act on particles on the lower surface. Consequently, these particles can be washed away by a liquid film of the pure water sprayed from the shower nozzle 127. The ultrasonic waves reaching the liquid film are reflected by an air layer having a largely different acoustic impedance. Therefore, the ultrasonic waves return to the upper surface of the wafer 137 through the wafer 137 while acting on particles on the lower surface. The ultrasonic waves returning to the upper surface are reflected by the interface between a liquid film on the upper surface of the wafer 137 and an air layer. The ultrasonic waves attenuate while being repetitively reflected as above. As described above, the shower nozzle 127 sprays pure water upon the lower surface of the semiconductor wafer 137 to form a liquid film. Therefore, without arranging the cleaning solution spray 2 for releasing ultrasonic waves toward the lower surface of the semiconductor wafer 137, the entire lower surface of the semiconductor wafer 137 can be simultaneously cleaned precisely.

A method of cleaning by switching the connections between a DC power supply 36 and inside and outside electrodes 23 and 29 in the cleaning solution spray 2 will be described below.

In the cleaning solution spray 2, the connections between the DC power supply 36 and the inside and outside electrodes 29 are switched as in step 2-1) described earlier. That is, the negative and positive terminals of the DC power supply 36 are connected to the inside and outside electrodes 23 and 29, respectively, thereby producing an $OH^-$-rich solution in the inside processing chamber $20_1$. This $OH^-$-rich solution is introduced from the inside processing chamber $20_1$ into the nozzle hole 10 through the cleaning solution passages 17. Ultrasonic waves generated by the vibrator 67 are made to act on the $OH^-$-rich solution, and the resultant $OH^-$-rich solution is sprayed upon the upper surface of the rotating semiconductor wafer 137 from the discharge port 4 of the nozzle 5 in the lower portion of the cylindrical main body 6. Consequently, a strong alkali detergency can be made to act on the semiconductor wafer 137 by the interaction between the $OH^-$-rich solution and the radicals contained in the solution. By simultaneously spraying pure water upon the lower surface of the wafer 137 from the shower nozzle 127, the entire lower surface of the semiconductor wafer 137 can also be precisely cleaned as described above.

After the silicon wafer 137 is cleaned as above, the spraying of the pure water from the shower nozzle 127 and the spraying of the cleaning solution from the cylindrical cleaning solution spray 2 are stopped. The driving shaft 101 is raised to rotate the rotary disk 116 at a high speed of, e.g., 3000 rpm. With this operation, the silicon wafer 137 placed on the support blocks 120 of the support rods 118 of the rotary disk 116 can be successively spin-dried.

Still another cleaning apparatus according to the present invention will be described in detail below with reference to FIGS. 8 to 14.

Figure 8:
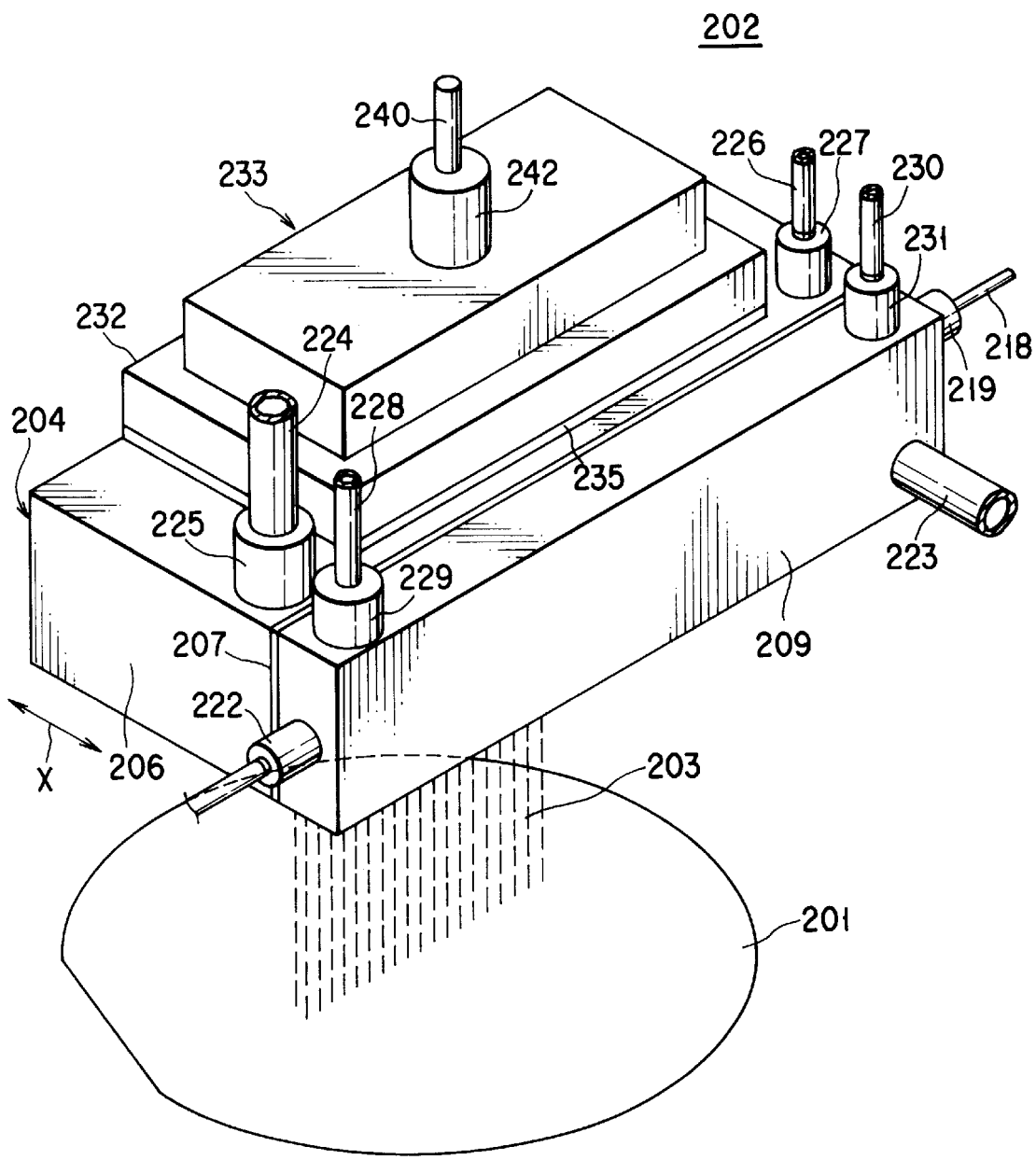
FIG. 8 is a perspective view showing still another cleaning apparatus according to the present invention.
Figure 9:
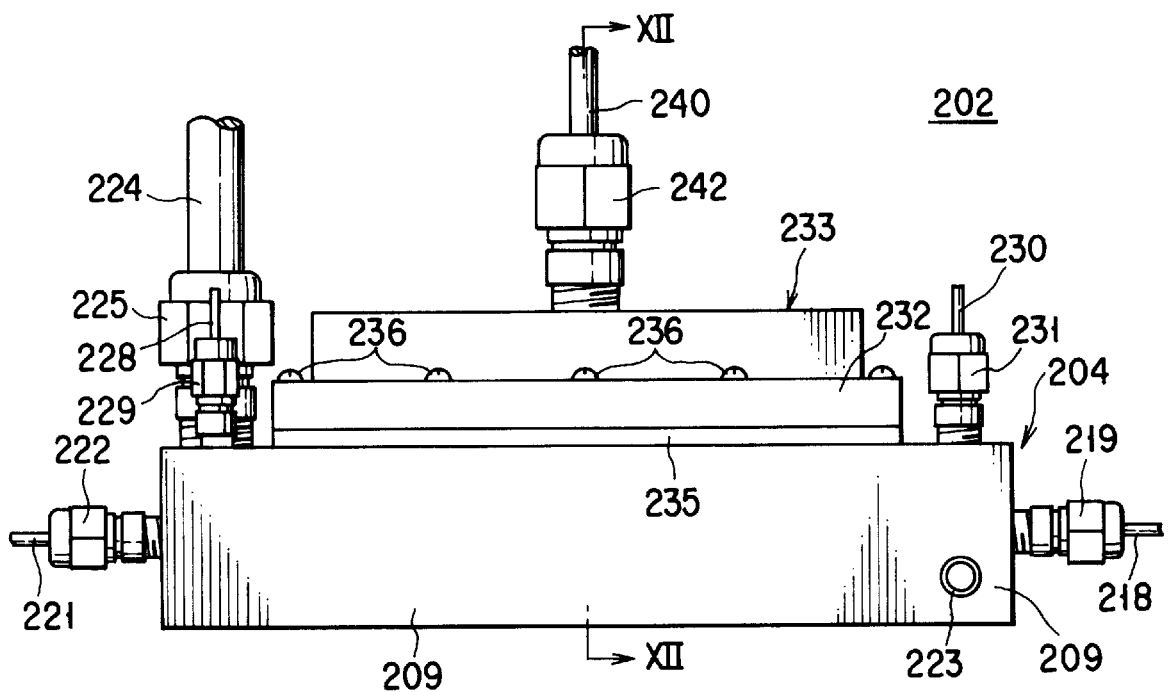
FIG. 9 is a front view showing a bar type cleaning solution spray in FIG. 8.
Figure 10:
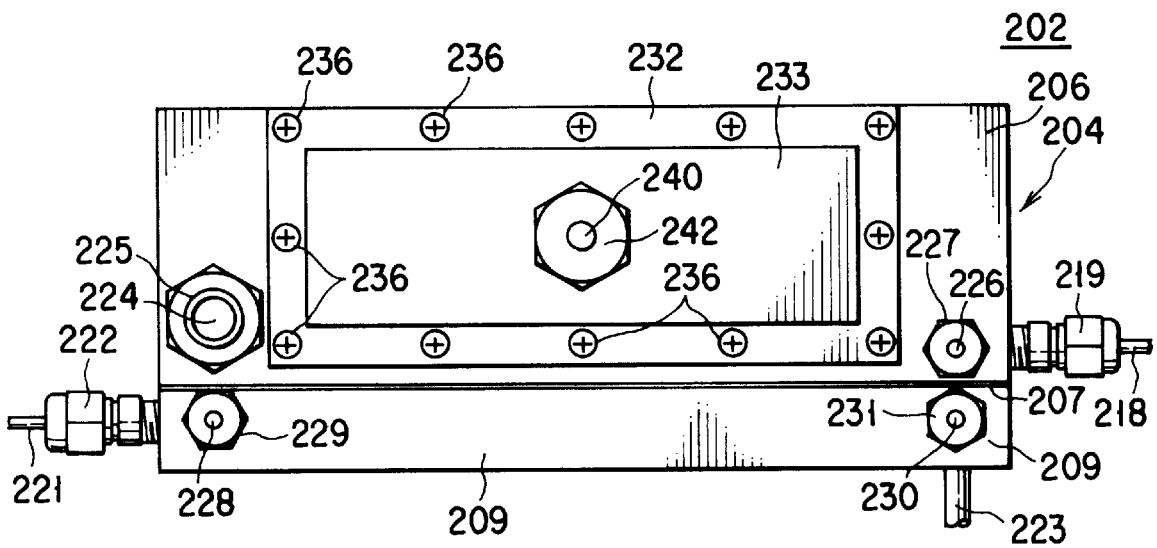
FIG. 10 is a top view showing the bar type cleaning solution spray in FIG. 8.
Figure 11:
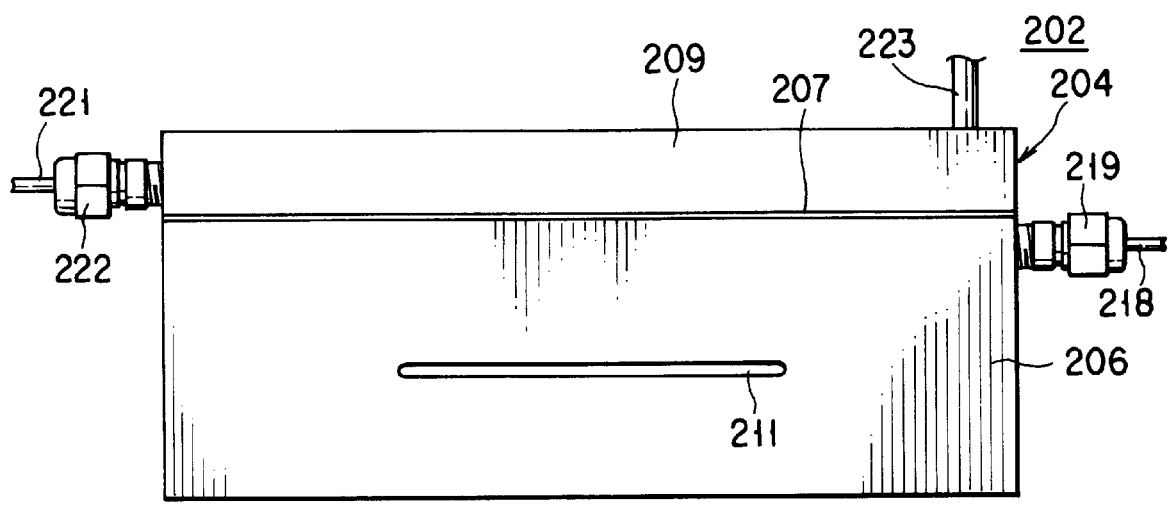
FIG. 11 is a bottom view showing the bar type cleaning solution spray in FIG. 8.
Figure 12:
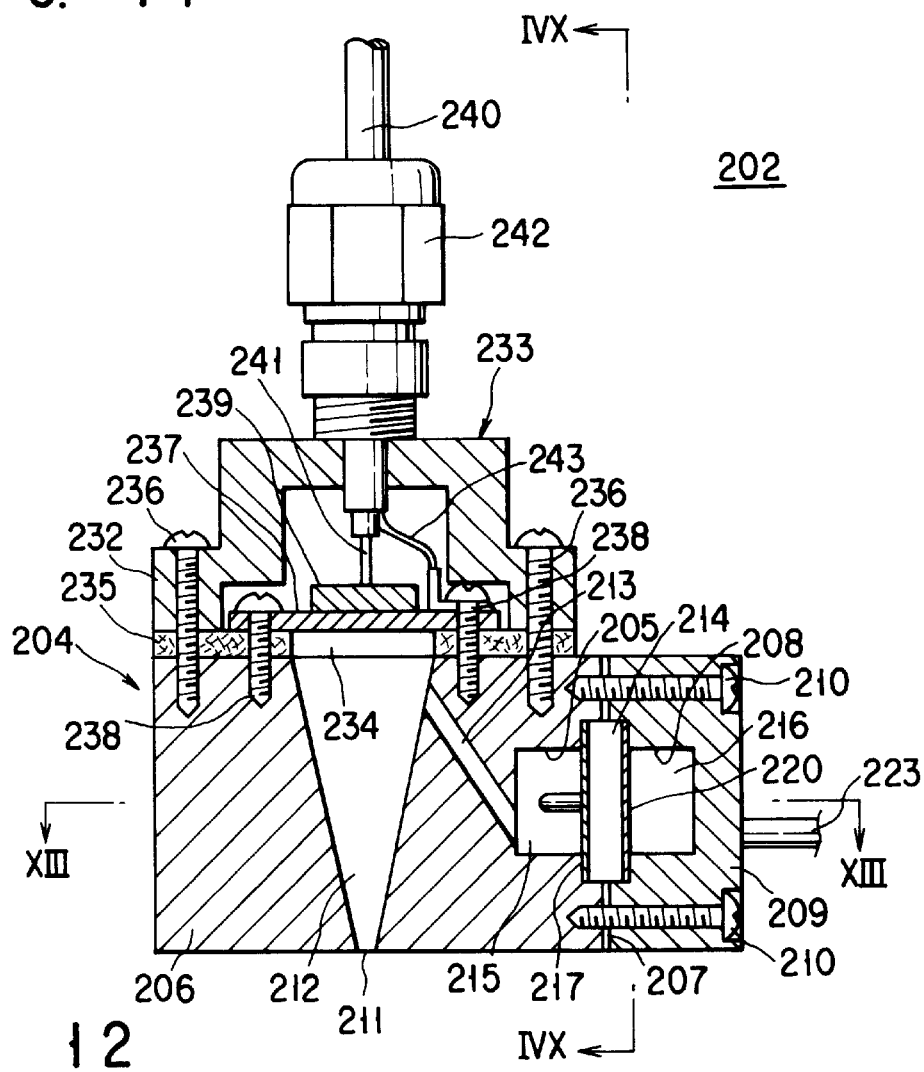
FIG. 12 is a sectional view of the bar type cleaning solution spray taken along a line XII—XII in FIG. 9.

FIG. 8 is a perspective view showing the cleaning apparatus. FIG. 9 is a front view showing a bar type cleaning solution spray. FIG. 10 is a top view showing the bar type cleaning solution spray in FIG. 8. FIG. 11 is a bottom view showing the bar type cleaning solution spray in FIG. 8. FIG. 12 is a sectional view of the bar type cleaning solution spray taken along a line XII—XII in FIG. 9. FIG. 13 is a sectional view of the bar type cleaning solution spray taken along a line XIII—XIII in FIG. 12. FIG. 14 is a sectional view of the bar type cleaning solution spray taken along a line IVX—IVX in FIG. 12.

The edge, for example, of a substrate to be cleaned (e.g., a semiconductor wafer) 201 is held by a substrate holding member (not shown). A bar type cleaning solution spray 202 sprays a cleaning solution 203 upon the semiconductor wafer 201. The cleaning solution spray 202 is moved in the X direction by a moving mechanism (not shown) connected to a handler (not shown) extending from a side surface of the spray 202.

The cleaning solution spray 202 has a rectangular main body 204. As shown in FIG. 12, this rectangular main body 204 includes a first oblong rectangular block 206, a second oblong rectangular block 209, a plurality of bolts 210, an oblong nozzle hole 212, and a plurality of cleaning solution passages 213. The first rectangular block 206 has a first trench 205 in the front surface. The second rectangular block 209 is arranged on the front surface of the first rectangular block 209 via a packing 207 and has a second trench 208 in a surface opposing the first rectangular block 206. The bolts 210 fix the second rectangular block 209 to the first rectangular block 206. The nozzle hole 212 is formed in the first rectangular block 206 and has an elongated cleaning solution discharge port 211 open in the lower surface. The cleaning solution passages 213 are formed in the first block 206 to allow the nozzle hole 212 and the first trench 205 (equivalent to an inside processing chamber to be described later) to communicate with each other.

An oblong plate-like $H^+$ ion exchange membrane 214 is clamped between the first and second rectangular blocks 206 and 209 around the first and second trenches 205 and 208. This arrangement of the ion exchange membrane 214 forms an oblong plate-like inside processing chamber 215 partitioned by the first trench 205 and the ion exchange membrane 214 and an oblong plate-like outside processing chamber 216 partitioned by the second trench 208 and the ion exchange membrane 214.

As shown in FIGS. 12 to 14, an inside electrode 217 made from an oblong porous plate having a large number of pores is fixed to the surface of the $H^+$ ion exchange membrane 214 on the side of the inside processing chamber 215. The inside electrode 217 is made from a material such as platinum-platinum oxide or platinum-plated titanium or tantalum. The front end of an inside cable 218 coated with an insulating tube is connected to the right side surface of the inside electrode 217. The rear end of the inside cable 218 extends to the outside through the right side surface of the first rectangular block 206 and through a cable fitting member 219 threadably engaging with the right side surface.

As shown in FIGS. 12 to 14, an outside electrode 220 made from an oblong porous plate having a large number of pores is fixed to the surface of the $H^+$ ion exchange membrane 214 on the side of the outside processing chamber 216. The outside electrode 220 is made from a material such as platinum-platinum oxide or platinum-plated titanium or tantalum. The front end of an outside cable 221 is connected to the left side surface of the outside electrode 220. The rear end of the outside cable 221 extends to the outside through the left side surface of the second rectangular block 209 and through a cable fitting member 222 threadably engaging with the left side surface.

The inside and outside cables 218 and 221 are connected to a DC power supply (not shown). An electrolytic processing water discharge pipe 223 is connected to the front surface at the right end of the second rectangular block 209 and discharges the processing water in the outside processing chamber 216 to the outside.

The $H^+$ ion exchange membrane 214, the inside processing chamber 215, the inside electrode 217, the outside processing chamber 216, the outside electrode 220, and the DC power supply (not shown) build an electrolytic ion generating member.

An inside pure water supply pipe 224 is supported and connected to the left-side upper surface of the first rectangular block 206 by a pipe fitting member 225 and communicates with the inside processing chamber 215. As shown in FIG. 10, an inside venting pipe 226 is supported and connected to the right-side upper surface of the first rectangular block 206 by a pipe fitting member 227 and communicates with the inside processing chamber 215. A pure water supply source (not shown) supplies pure water to the inside pure water supply pipe 224, and an inside pure water flow rate control valve (not shown) is inserted in the middle of the supply pipe 224. A flow rate control valve (not shown) is inserted in the middle of the inside venting pipe 226. Since the flow rate control valves (neither is shown) are thus inserted midway along the inside pure water supply pipe 224 and the inside venting pipe 226, the discharge of the electrolytic processing solution (cleaning solution) together with the gas from the inside venting pipe 226 can be suppressed by controlling the pressure balance in the inside processing chamber 215 by regulating the openings of these valves. When $OH^-$ ions are generated in the inside processing chamber 215 by electrolytic processing, the gas discharged together with the electrolytic processing solution from the inside venting pipe 226 is primarily oxygen. Therefore, this gas is directly discharged without any gas discharge processing.

An outside pure water supply pipe 228 is supported and connected to the left-side upper surface of the second rectangular block 209 by a pipe fitting member 229 and communicates with the outside processing chamber 216. An outside venting pipe 230 is supported and connected to the right-side upper surface of the second rectangular block 209 by a pipe fitting member 231 and communicates with the outside processing chamber 216. A pure water supply source (not shown) supplies pure water to the outside pure water supply pipe 228, and an outside pure water flow rate control valve (not shown) is inserted in the middle of the supply pipe 228. The outside venting pipe 230 is connected to a gas-liquid separator (not shown). This gas-liquid separator is connected to a processing tower (not shown) containing a hydrogen gas processing catalyst.

The inside venting pipe 226 is connected to the gas-liquid separator when a state in which the positive and negative terminal of the DC power supply (not shown) are connected to the inside and outside electrodes 217 and 220, respectively (in this state $H^+$ ions are generated in the inside processing chamber 215 and $OH^-$ ions are generated in the outside processing chamber 216), is switched to a state in which the positive and negative terminals are connected to the outside and inside electrodes 220 and 217, respectively (in this state $OH^-$ ions are generated in the inside processing chamber 215 and $H^+$ ions are generated in the outside processing chamber). On the other hand, the gas discharged together with the electrolytic processing solution from the outside venting pipe 230 is primarily oxygen. Therefore, this gas is directly discharged without any gas discharge processing.

As shown in FIGS. 10 and 12, a rectangular cap 233 having an edge 232 on the periphery is arranged near the center of the upper surface of the first rectangular block 206. A rectangular packing 235 having a long hole 234 matching the oblong nozzle hole 212 is inserted between the upper surface of the first rectangular block 206 and the rectangular cap 233. The rectangular cap 233 is fixed to the first rectangular block 206 by threadably engaging a plurality of screws 236 from the edge 232 toward the first rectangular block 206. A rectangular vibrating plate 237 is surrounded by the rectangular cap 233 and fixed to the upper surface of the packing 235 including the nozzle hole 212 by a plurality of screws 238. A rectangular vibrator 239 is fixed on the vibrating plate 237. One end of a main terminal 241 of a power-supply cable 240 is connected to the vibrator 239. The other end of the power-supply cable 240 extends to the outside through the cap 233 and a cable fitting member 242 attached to the cap 233. A ground terminal 243 coaxially attached to the power-supply cable 240 is connected to the vibrating plate 237. The vibrating plate 237, the vibrator 239, and the power-supply cable 240 constitute an RF generating member. The power-supply cable 240 is also connected to an RF oscillator (not shown).

A method by which the cleaning apparatus shown in FIGS. 8 to 14 cleans a substrate to be cleaned (e.g., a semiconductor wafer) will be described below.

4-1) First, as shown in FIG. 8, the edge of the substrate to be cleaned (e.g., a semiconductor wafer) 201 is held by the substrate holding member (not shown).

4-2) As shown in FIGS. 8, 12, and 13, the pure water supply source (not shown) supplies pure water into the inside processing chamber 215 of the main body 204 through the inside pure water supply pipe 224 connected to the upper left portion of the first rectangular block 206 of the rectangular main body 204. As shown in FIG. 13, the supplied pure water flows in the inside processing chamber 215 to the right side of the rectangular main body 204 along the oblong inside electrode 217 fixed to the ion exchange membrane 214. The pure water flows out into the oblong nozzle hole 212 in the center of the first rectangular block 206 through the cleaning solution passages 213 formed in the first rectangular block 206. At the same time, the pure water supply source (not shown) supplies pure water into the outside processing chamber 216 of the main body 204 through the outside pure water supply pipe 228 connected to the upper left portion of the second rectangular block 209 of the main body 204. As shown in FIG. 13, the supplied pure water flows in the outside processing chamber 216 to the right side of the rectangular main body 204 along the oblong outside electrode 220 fixed to the ion exchange membrane 214. The pure water is discharged to the outside from the electrolytic processing water discharge pipe 223 connected to the right-side front surface of the second rectangular block 209.

4-3) While the pure water is supplied to the inside and outside processing chambers 215 and 216, the positive terminal of the DC power supply (not shown) is connected to the inside electrode 217 fixed to the surface of the $H^+$ ion exchange membrane 214 on the side of the inside processing chamber 215 through the inside external cable 218 supported to the main body 204 by the cable fitting member 219. On the other hand, the negative terminal is connected to the outside electrode 220 fixed to the surface of the $H^+$ ion exchange membrane 214 on the side of the outside processing chamber 216 through the outside external cable 221 supported to the main body 204 by the cable fitting member 222. Predetermined voltage and current are supplied to the electrodes 217 and 220 thus connected. Consequently, an electrolytic reaction, $2H_2O - 4e^- \rightarrow O_2 + 4H^+$, occurs on the positive electrode (inside electrode) 217 to produce an enough amount of $H^+$ in the pure water flowing in the inside processing chamber 215. As shown in FIG. 13, this $H^+$-rich solution flows out from the inside processing chamber 215 into the oblong nozzle hole 212 in the center of the first rectangular block 206 through the cleaning solution passages 213 formed in the first rectangular block 206. The $H^+$-rich solution is sprayed in the form of a belt from the elongated discharge port 211 in the lower end of the nozzle hole 212.

Simultaneously, an $OH^-$-rich solution is produced in the outside processing chamber 216. This $OH^-$-rich solution is discharged to the outside from the electrolytic processing water discharge pipe 223 through the flow path described above.

When the electrolytic processing of the pure water is performed in the rectangular main body 204, oxygen gas ($O_2$) produced together with $H^+$ in the inside processing chamber 215 is released. This oxygen gas is discharged to the outside together with the $H^+$-rich solution from the inside venting pipe 226 supported to the upper right portion of the first rectangular block 206 by the pipe fitting member 227.

Furthermore, when the electrolytic processing of the pure water is performed in the rectangular main body 204, hydrogen gas ($H_2$) produced together with $OH^-$ in the outside processing chamber 216 is released. This hydrogen gas is discharged to the outside together with the $OH^-$-rich solution from the outside venting pipe 230 supported to the upper right portion of the second rectangular block 209 by the pipe fitting member 231. Since this discharged solution contains hydrogen and is dangerous, the solution is discharged to the gas-liquid separator (not shown). Hydrogen separated by the gas-liquid separator is removed through the processing tower (not shown) containing a hydrogen gas processing catalyst and vented in a safe condition.

4-4) After the production of the $H^+$-rich solution in the inside processing chamber 215 stabilizes, the bar type cleaning solution spray 202 is moved to a position above the semiconductor wafer 201, as shown in FIG. 8, by the moving mechanism (not shown) connected to the handler (not shown). At the same time, the cleaning solution spray 202 is moved in one direction (the X direction in FIG. 8) while the $H^+$-rich solution (cleaning solution) is sprayed in the form of a belt upon the semiconductor wafer 201 from the elongated discharge port 211 in the lower end of the nozzle hole 212 of the cleaning solution spray 202. Consequently, acid cleaning (equivalent to SC-2 cleaning) is performed over the entire surface of the semiconductor wafer 201.

Cleaning performed by switching the connections between the DC power supply (not shown) and the inside and outside electrodes 217 and 220 will be described next.

5-1) While pure water is supplied to the oblong inside and outside processing chambers 215 and 216 as in steps 4-1) and 4-2) described above, the negative terminal of the DC power supply is connected to the inside electrode 217 fixed to the surface of the $H^+$ ion exchange membrane 214 on the side of the inside processing chamber 215. On the other hand, the positive terminal is connected to the outside electrode 220 fixed to the surface of the $H^+$ ion exchange membrane 214 on the side of the outside processing chamber 216. Predetermined voltage and current are applied to the electrodes 217 and 220 thus connected. Consequently, an electrolytic reaction, $2H_2O+2e^- \rightarrow H_2+2OH^-$, occurs on the negative electrode (inside electrode) 217, and an enough amount of $OH^-$ is produced in the inside processing chamber 215. As described above, this $OH^-$-rich solution flows out from the inside processing chamber 215 into the oblong nozzle hole 212 in the center of the first rectangular block 206 through the cleaning solution passages 213 formed in the first rectangular block 206 and is sprayed in the form of a belt from the elongated discharge port 211 at the lower end of the nozzle hole 212.

Note that an $H^+$-rich solution is produced in the outside processing chamber 216 and discharged to the outside from the electrolytic processing water discharge pipe 223 as described previously. Also, when the pure water electrolytic processing is performed in the rectangular main body 204, hydrogen gas is additionally produced in the inside processing chamber 215. This hydrogen gas passes through the inside venting pipe 226 and is vented in a safe condition via the gas-liquid separator and the processing tower (neither is shown). Furthermore, oxygen gas additionally produced in the outside processing chamber 216 is discharged together with the $H^+$-rich solution through the outside venting pipe 230.

5-2) After the production of the $OH^-$-rich solution in the inside processing chamber 215 stabilizes, the bar type cleaning solution spray 202 is moved to a position above the semiconductor wafer 201, as shown in FIG. 8, by the moving mechanism (not shown) connected to the handler (not shown). Simultaneously, the cleaning solution spray 202 is moved in one direction (the X direction in FIG. 8) while the $OH^-$-rich solution (cleaning solution) 203 is sprayed in the form of a belt upon the semiconductor wafer 201 from the elongated discharge port 211 at the lower end of the nozzle hole 212 of the cleaning solution spray 202. Consequently, alkali cleaning (equivalent to SC-1 cleaning) is performed over the entire surface of the semiconductor wafer 1. Unlike conventional cleaning using a chemical solution, pure water is used in this alkali cleaning. Therefore, the etching action on the semiconductor wafer 201 is extremely weak. Hence, it is possible to prevent the generation of COPs on the wafer 201.

In the acid cleaning and the alkali cleaning described above, the relationship between the voltage and the current applied to the inside and outside electrodes 217 and 220 is defined by the distance between the electrodes, the electrode areas, and the characteristic values and the thickness of the $H^+$ ion exchange membrane. Accordingly, the ranges of these numeric values cannot be specified. However, when the efficiency of the electrolytic reaction and the safety in operation are taken into consideration, it is preferable to set ranges of 10V to a few tens of V and 0.05 to 0.5 A/cm$^2$.

In the cleaning method according to the present invention as described above, a cleaning solution such as the $H^+$-rich solution (or the $OH^-$-rich solution) produced in the oblong inside processing chamber 215 of the bar type cleaning solution spray 202 can be rapidly sprayed, with no time delay, upon the semiconductor wafer 201 from the elongated discharge port 211 of the nozzle hole 212. That is, the cleaning solution containing active $H^+$ ions (or active $OH^-$ ions) can be immediately sprayed upon the semiconductor wafer 201. Consequently, acid cleaning (or alkali cleaning) can be well performed for the semiconductor wafer 201. Additionally, the cleaning solution 203 can be sprayed in the form of a belt from the elongated discharge port 211 in the nozzle hole 212 of the rectangular main body 204. Therefore, a wider area of the semiconductor wafer 201 can be cleaned by one-time spraying than when the cylindrical cleaning solution spray 2 shown in FIGS. 1 to 6 described previously is used.

Also, acid cleaning or alkali cleaning can be easily selected by switching the polarities to the oblong inside and outside electrodes 217 and 220 by the DC power supply (not shown). Additionally, the consumption amount of pure water can be decreased compared to electrolytic processing in a common processing bath.

Furthermore, as shown in FIG. 13, the $H^+$ ion exchange membrane 214 is arranged in the rectangular main body 204 along the longitudinal direction of the main body 204, and the oblong inside and outside electrodes 217 and 220 are arranged on the two sides of the $H^+$ ion exchange membrane 214. Therefore, when an electrolytic reaction occurs in the rectangular main body 204, this electrolytic reaction efficiently proceeds in the inside and outside processing chambers 215 and 216, and a solution extremely rich in H$^+$ (or a solution extremely rich in OH$^-$) is produced in the inside processing chamber 215. So, the detergency to the semiconductor wafer 201 can be further increased.

Moreover, since the inside and outside electrodes 217 and 220 (particularly the inside electrode 217) arranged (fixed) on the two sides of the H$^+$ ion exchange membrane 214 are made from a porous plate, the electrolysis of pure water readily takes place. This further improves the production efficiency of H$^+$ (or OH$^-$). It is preferable to arrange pores about 2 to 3 mm in diameter at a pitch of 2 to 3 mm in this porous plate.

A method of cleaning by driving the ultrasonic wave generating member incorporated into the rectangular main body 204 of the bar type cleaning solution spray 202 will be described below.

Following steps 4-1) to 4-3) described previously, an H$^+$-rich solution is produced in the inside processing chamber 215 of the rectangular main body 204. This solution is made to flow out from the inside processing chamber 215 into the oblong nozzle hole 212 open in the center of the first rectangular block 206 through the cleaning solution passages 213 formed in the first rectangular block 206. At the same time, as shown in FIG. 12, the RF oscillator (not shown) supplies a radio frequency of, e.g., 500 kHz to 3 MHz to the rectangular vibrator 239 immediately above the nozzle hole 212 through the power-supply cable 240 and the main terminal 241. Consequently, the vibrator 239 vibrates, the vibration is transmitted to the vibrating plate 237, and the resultant ultrasonic waves act on the H$^+$-rich solution in the nozzle hole 212. As shown in FIG. 8, the H$^+$-rich solution (cleaning solution) 203 under the influence of the ultrasonic waves is sprayed in the form of a belt upon the semiconductor wafer 201 from the elongated discharge port 211 of the nozzle hole 212. As a result, any particles on the surface of the wafer 201 can also be well removed. It is also possible to obtain a new effect in addition to the removal of particles.

That is, as shown in FIGS. 12 and 13, the ultrasonic waves generated by the vibrating plate 237 are made to act on the H$^+$-rich solution introduced from the inside processing chamber 215 into the oblong nozzle hole 212 through the cleaning solution passages 213. Consequently, the solution is made radical and activated. This activated state of the H$^+$-rich solution (cleaning solution) is maintained nearly the same while the activated H$^+$-rich solution is sprayed in the form of a belt upon the surface of the semiconductor wafer 201 from the elongated discharge port 211 in the nozzle hole 212 of the rectangular main body 6. Therefore, a strong acid detergency can be made act upon the semiconductor wafer 201 by the interaction between the H$^+$-rich solution and the radicals contained in the solution. As a result, precise cleaning can be performed by the combination of this action and the removal of particles from the surface of the wafer 201 described above.

Additionally, the connections between the DC power supply and the inside and outside electrodes 217 and 220 are switched. That is, an OH$^-$-rich solution is produced in the inside processing chamber 215 by connecting the negative and positive terminals of the DC power supply to the inside and outside electrodes 217 and 220, respectively. This OH$^-$-rich solution is introduced from the inside processing chamber 215 into the oblong nozzle hole 212 through the cleaning solution passages 213, acted upon by the ultrasonic waves generated by the vibrating plate 237, and sprayed upon the surface of the semiconductor wafer 201 from the elongated discharge port 211 in the nozzle hole 212 of the rectangular main body 204. With this spraying, a strong alkali detergency can be made act upon the semiconductor wafer 201 by the interaction between the OH$^-$-rich solution and the radicals contained in the solution. As a consequence, precise cleaning can be performed by the combination of this action and the removal of particles from the surface of the wafer 201 described above.

Note that the bar type cleaning solution spray 202 with the structure shown in FIGS. 8 to 14 can be arranged, instead of the cylindrical cleaning solution spray 2 shown in FIG. 7, above the rotatable silicon wafer 137.

Preferred examples of the present invention will be described in detail below with reference to FIGS. 1 to 7 described earlier.

EXAMPLES 1 & 2

First, the surfaces of an 8" silicon wafer which was sliced from a single-crystal silicon pulled at a rate of 0.4 mm/min and had two polished surfaces were intentionally contaminated by a silicon powder of about 0.18 μm or more, and the resultant wafer was used as a sample.

As shown in FIG. 7, the silicon wafer 137 was horizontally placed on the support blocks 120 of the four support rods 118 extending from the rotary disk 116 of the rotating means. The motor 102 was driven to rotate the rotating shaft 101 and rotate the driving timing pulley 134 fixed to the driving shaft 101. The rotating force of the timing pulley 134 was transmitted to the timing pulley 132 to be driven via the timing belt 136, and thereby the rotary disk 116 having the cylinder 115 to which the timing pulley 132 was attached rotated about the cylindrical fixed shaft 122. Consequently, the silicon wafer 137 placed on the support blocks 120 at the upper ends of the four support rods 118 inserted into and fixed to the rotary disk 116 rotated at a speed of 1500 rpm.

Subsequently, in the cylindrical cleaning solution spray 2 shown in FIGS. 1 to 6, pure water was supplied to the inside processing chamber 20$_1$ and the outside processing chamber 20$_2$ of the cylindrical main body 6 following step 1-2) described previously. Thereafter, following step 2-1) described earlier, the negative terminal of the DC power supply 36 was connected to the inside electrode 23 fixed to the surface of the H$^+$ ion exchange membrane 19 on the side of the inside processing chamber 20$_1$, and the positive terminal was connected to the outside electrode 29 fixed to the surface of the H$^+$ ion exchange membrane 19 on the side of the outside processing chamber 20$_2$. Different voltages shown in Table 1 (to be presented later) were applied to the electrodes 23 and 29 thus connected, thereby producing an OH$^-$-rich solution in the inside processing chamber 20$_1$. This OH$^-$-rich solution was introduced from the inside processing chamber 20$_1$ into the nozzle hole 10 through the cleaning solution passages 17, passed through the nozzle 5 communicating with the nozzle hole 10, and sprayed at a flow rate of 0.8 L/min for 30 sec upon the surface of the rotating silicon wafer 137 from the circular discharge port 4 at the lower end of the nozzle 5. Simultaneously, the cleaning solution spray 2 was moved back and forth at a speed of 1.0 m/min within the range of the radius of the silicon wafer 137. In this manner, alkali cleaning was performed for the silicon wafer 137.

EXAMPLES 3 & 4

In the cylindrical cleaning solution spray 2, an OH$^-$-rich solution was introduced from the inside processing chamber $20_1$ of the cylindrical main body 6 into the nozzle hole 10 as in Example 1. At the same time, a radio frequency was supplied from the RF oscillator 79 to the disk-like vibrator 67 immediately above the nozzle hole 10, thereby vibrating the vibrator 67 at different frequencies shown in Table 1 and producing radicals in the OH⁻-rich solution. The resultant solution was carried on ultrasonic waves and sprayed at a flow rate of 0.8 L/min for 30 sec upon the surface of the rotating semiconductor wafer 137 from the discharge port 4 of the nozzle 5 in the lower portion of the cylindrical main body 6. Simultaneously, the cleaning solution spray 2 was moved back and forth at a speed of 1.0 m/min within the range of the radius of the silicon wafer 137. In this manner, alkali cleaning was performed for the silicon wafer 137.

COMPARATIVE EXAMPLE 1

Alkali cleaning (SC-1 cleaning) was performed by dipping an 8" silicon wafer similar to the one used in Example 1 into a cleaning bath containing an alkali cleaning solution containing 5 wt % of $NH_4OH$ and 5 wt % of $H_2O_2$ for 180 sec.

COMPARATIVE EXAMPLE 2

In the cleaning apparatus shown in FIG. 7, a bar type shower nozzle was used instead of the cylindrical cleaning solution spray 2. The silicon wafer 137 was cleaned following the same procedures as in Example 1 except that pure water was sprayed at a flow rate of 0.8 L/min upon the rotating silicon wafer 137 from the shower nozzle.

COMPARATIVE EXAMPLE 3

In the cleaning apparatus shown in FIG. 7, while no DC voltage was applied to the inside and outside electrodes 23 and 29, i.e., no OH⁻-rich solution was produced in the inside processing chamber $20_1$, a radio frequency was supplied from the RF oscillator 79 to the disk-like vibrator 67 immediately above the nozzle hole 10, thereby vibrating the vibrator 67 at 1.5 MHz. In this manner, pure water introduced into the nozzle hole 10 was carried on ultrasonic waves and sprayed at a flow rate of 0.8 L/min for 30 sec upon the surface of the rotating semiconductor wafer 137 from the discharge port 4 of the nozzle 5 in the lower portion of the cylindrical main body 6. Simultaneously, the cleaning solution spray 2 was moved back and forth at a speed of 1.0 m/min within the range of the radius of the silicon wafer 137 as in Example 1. In this manner the silicon wafer 137 was cleaned.

Silicon particles with particle sizes of 0.18 or more on the surfaces of ten silicon wafers cleaned in Examples 1 to 4 and Comparative Examples 1 to 3 were counted by a particle counter LS-6030 (tradename) commercially available from Hitachi Electronics Engineering, Co., Ltd., and the average values were calculated. The results are summarized in Table 1 below.

| | Applied voltage (V) | Ultrasonic action | Cleaning method | Particle measurement result (particles/ 200 mm diameter substrate) |
|---|---|---|---|---|
| Example 1 | 30 | None | Spray of OH⁻-rich solution | 1630 |
| Example 2 | 60 | None | Spray of OH⁻-rich solution | 1290 |
| Example 3 | 60 | 800 kHz | Spray of OH⁻-rich solution + ultrasonic waves | 450 |
| Example 4 | 60 | 1.5 mHz | Spray of OH⁻-rich solution + ultrasonic waves | 360 |
| Comparative Example 1 | — | None | SC-1 | 9230 |
| Comparative Example 2 | — | None | Spray of pure water | 8560 |
| Comparative Example 3 | — | 1.5 MHz | Spray of pure water on ultrasonic waves | 519 |

As is apparent from Table 1, the cleaning methods of Examples 1 and 2 in which the cylindrical cleaning solution spray was used to spray an OH⁻-rich solution (cleaning solution) upon a silicon wafer could remove particles from the surface of the silicon wafer better than in the cleaning method of Comparative Example 1 (SC-1) and the cleaning method of Comparative Example 2 in which shower spraying was performed.

Also, the cleaning methods of Examples 3 and 4 in which the cylindrical cleaning solution spray was used to spray an OH⁻-rich solution upon a silicon wafer by making ultrasonic waves act on the OH⁻-rich solution could remove particles from the surface of the silicon wafer better than in the cleaning methods of Examples 1 and 2. Furthermore, the cleaning methods of Examples 3 and 4 could perform precise cleaning because the methods had the ability to remove particles higher than that of the cleaning method of Comparative Example 3 in which pure water was sprayed upon a silicon wafer by making ultrasonic waves act on the pure water.

EXAMPLES 5 & 6

First, an 8" silicon wafer which was sliced from a single-crystal silicon pulled at a rate of 0.4 mm/min and had two polished surfaces was used as a sample.

As shown in FIG. 7, the silicon wafer 137 was horizontally placed on the support blocks 120 of the four support rods 118 extending from the rotary disk 116 of the rotating means. The motor 102 was driven to rotate the rotating shaft 101 and rotate the driving timing pulley 134 fixed to the driving shaft 101. The rotating force of the timing pulley 134 was transmitted to the timing pulley 132 to be driven via the timing belt 136, and thereby the rotary disk 116 having the cylinder 115 to which the timing pulley 132 was attached rotated about the cylindrical fixed shaft 122. Consequently, the silicon wafer 137 placed on the support blocks 120 at the upper ends of the four support rods 118 inserted into and fixed to the rotary disk 116 rotated at a speed of 1500 rpm.

Subsequently, in the cylindrical cleaning solution spray 2 shown in FIGS. 1 to 6, pure water was supplied to the inside processing chamber $20_1$ and the outside processing chamber $20_2$ of the cylindrical main body 6 following step 1-2) described previously. Thereafter, following step 1-3) described earlier, the positive terminal of the DC power supply 36 was connected to the inside electrode 23 fixed to the surface of the H$^+$ ion exchange membrane 19 on the side of the inside processing chamber 20$_1$, and the negative terminal was connected to the outside electrode 29 fixed to the surface of the H$^+$ ion exchange membrane 19 on the side of the outside processing chamber 20$_2$. Different voltages shown in Table 2 (to be presented later) were applied to the electrodes 23 and 29 thus connected, thereby producing an H$^+$-rich solution in the inside processing chamber 20$_1$. This H$^+$-rich solution was introduced from the inside processing chamber 20$_1$ into the nozzle hole 10 through the cleaning solution passages 17, passed through the nozzle 5 communicating with the nozzle hole 10, and sprayed at a flow rate of 0.8 L/min for 30 sec upon the surface of the rotating silicon wafer 137 from the circular discharge port 4 at the lower end of the nozzle 5. Simultaneously, the cleaning solution spray 2 was moved back and forth at a speed of 1.0 m/min within the range of the radius of the silicon wafer 137. In this way, acid cleaning was performed for the silicon wafer 137.

EXAMPLES 7 & 8

In the cylindrical cleaning solution spray 2, an H$^+$-rich solution was introduced from the inside processing chamber 20$_1$ of the cylindrical main body 6 into the nozzle hole 10 as in Examples 5 and 6. At the same time, a radio frequency was supplied from the RF oscillator 79 to the disk-like vibrator 67 immediately above the nozzle hole 10, thereby vibrating the vibrator 67 at different frequencies shown in Table 2 and producing radicals in the H$^+$-rich solution. The resultant solution was carried on ultrasonic waves and sprayed at a flow rate of 0.8 L/min for 30 sec upon the surface of the rotating semiconductor wafer 137 from the discharge port 4 of the nozzle 5 in the lower portion of the cylindrical main body 6. Simultaneously, the cleaning solution spray 2 was moved back and forth at a speed of 1.0 m/min within the range of the radius of the silicon wafer 137. In this fashion, acid cleaning was performed for the silicon wafer 137.

COMPARATIVE EXAMPLE 4

Acid cleaning (SC-2) was performed by dipping an 8" silicon wafer similar to the one used in Example 5 into a cleaning bath containing an alkali cleaning solution containing 5 wt % of HF and 5 wt % of H$_2$O$_2$ for 180 sec.

COMPARATIVE EXAMPLE 5

In the cleaning apparatus shown in FIG. 7, a bar type shower nozzle was used instead of the cylindrical cleaning solution spray 2. The silicon wafer 137 was cleaned following the same procedures as in Examples 5 and 6 except that pure water was sprayed at a flow rate of 0.8 L/min upon the rotating silicon wafer 137 from the shower nozzle.

COMPARATIVE EXAMPLE 6

In the cleaning apparatus shown in FIG. 7, while no DC voltage was applied to the inside and outside electrodes 23 and 29, i.e., no H$^+$-rich solution was produced in the inside processing chamber 20$_1$, a radio frequency was supplied from the RF oscillator 79 to the disk-like vibrator 67 immediately above the nozzle hole 10, thereby vibrating the vibrator 67 at 1.5 MHz. In this manner, pure water introduced into the nozzle hole 10 was carried on ultrasonic waves and sprayed at a flow rate of 0.8 L/min for 30 sec upon the surface of the rotating semiconductor wafer 137 from the discharge port 4 of the nozzle 5 in the lower portion of the cylindrical main body 6. Simultaneously, the cleaning solution spray 2 was moved back and forth at a speed of 1.0 m/min within the range of the radius of the silicon wafer 137 as in Examples 5 and 6.

The surfaces of ten silicon wafers cleaned in Examples 5 to 8 and Comparative Examples 4 to 6 were cleaned with dilute hydrofluoric acid. The amounts of Al, Cu, and Fe of the resultant solutions were measured by ICP mass spectrometry, and the average values were calculated. The results are summarized in Table 2 below.

TABLE 2

| | Applied voltage (V) | Ultrasonic action | Cleaning method | Surface metal impurity level (atoms/cm$^2$) | | |
|---|---|---|---|---|---|---|
| | | | | Al | Cu | Fe |
| Example 5 | 30 | None | Spray of H$^+$-rich solution | 2.9 × 10$^9$ | 3.3 × 10$^9$ | 2.1 × 10$^9$ |
| Example 6 | 60 | None | Spray of H$^+$-rich solution | N.D. | 5.5 × 10$^8$ | 5.5 × 10$^8$ |
| Example 7 | 60 | 800 kHz | Spray of H$^+$-rich solution + ultrasonic waves | N.D. | N.D. | N.D. |
| Example 8 | 60 | 1.5 MHz | Spray of H$^+$-rich solution + ultrasonic waves | N.D. | N.D. | N.D. |
| Comparative Example 4 | — | None | SC-2 | 3.0 × 10$^9$ | 6.5 × 10$^9$ | 2.3 × 10$^9$ |
| Comparative Example 5 | — | None | Spray of pure water | 3.5 × 10$^{11}$ | 5.5 × 10$^{11}$ | 8.6 × 10$^{11}$ |
| Comparative Example 6 | — | 1.5 MHz | spray of pure water on ultrasonic waves | 2.0 × 10$^{10}$ | 8.5 × 10$^{10}$ | 6.5 × 10$^{10}$ |

As is apparent from Table 2, the cleaning methods of Examples 5 and 6 in which the cylindrical cleaning solution spray was used to spray an H$^+$-rich solution (cleaning solution) upon a silicon wafer had the ability to remove surface metal impurities from a silicon wafer equivalent to or higher than that of Comparative Example 4 (SC-2). Also, the cleaning methods of Examples 5 and 6 could remove surface metal impurities from a silicon wafer much better than in the cleaning method of Comparative Example 5 in which shower spraying was performed.

Furthermore, the cleaning methods of Examples 7 and 8 in which the cylindrical cleaning solution spray was used to spray an H$^+$-rich solution upon a silicon wafer by making ultrasonic waves act on the H$^+$-rich solution could remove surface metal impurities from the silicon wafer better than in the cleaning methods of Examples 5 and 6. Additionally, the cleaning methods of Examples 7 and 8 could perform precise cleaning because the methods had the ability to remove surface metal impurities higher than that of the cleaning method of Comparative Example 6 in which pure water was sprayed upon a silicon wafer by making ultrasonic waves act on the pure water.

EXAMPLE 9

First, the surfaces of an 8" silicon wafer which was cut out from a single-crystal silicon pulled up at a rate of 0.4 mm/min and had two polished surfaces were forcedly contaminated by a silicon powder of about 0.18 μm or more, and the resultant wafer was used as a sample.

As shown in FIG. 7, the silicon wafer 137 was horizontally placed on the support blocks 120 of the four support rods 118 extending from the rotary disk 116 of the rotating means. The motor 102 was driven to rotate the rotating shaft 101 and rotate the driving timing pulley 134 fixed to the driving shaft 101. The rotating force of the timing pulley 134 was transmitted to the timing pulley 132 to be driven via the timing belt 136, and thereby the rotary disk 116 having the cylinder 115 to which the timing pulley 132 was attached rotated about the cylindrical fixed shaft 122. Consequently, the silicon wafer 137 placed on the support blocks 120 at the upper ends of the four support rods 118 inserted into and fixed to the rotary disk 116 rotated at a speed of 1500 rpm.

Subsequently, in the cylindrical cleaning solution spray 2 shown in FIGS. 1 to 6, pure water was supplied to the inside processing chamber $20_1$ and the outside processing chamber $20_2$ of the cylindrical main body 6 following step 1-2) described previously. Thereafter, following step 2-1) described earlier, the negative terminal of the DC power supply 36 was connected to the inside electrode 23 fixed to the surface of the $H^+$ ion exchange membrane 19 on the side of the inside processing chamber $20_1$, and the positive terminal was connected to the outside electrode 29 fixed to the surface of the $H^+$ ion exchange membrane 19 on the side of the outside processing chamber $20_2$. A voltage shown in Table 3 (to be presented later) was applied to the electrodes 23 and 29 thus connected, thereby producing an $OH^-$-rich solution in the inside processing chamber $20_1$. This $OH^-$-rich solution was introduced from the inside processing chamber $20_1$ into the nozzle hole 10 through the cleaning solution passages 17, passed through the nozzle 5 communicating with the nozzle hole 10, and sprayed at a flow rate of 0.8 L/min for 30 sec upon the surface of the rotating silicon wafer 137 from the circular discharge port 4 at the end of the nozzle 5. Simultaneously, the cleaning solution spray 2 was moved back and forth at a speed of 1.0 m/min within the range of the radius of the silicon wafer 137. In this manner, alkali cleaning was performed for the silicon wafer 137.

Subsequently, in the cylindrical cleaning solution spray 2 shown in FIGS. 1 to 6, the connecting polarities between the DC power supply 36 and the inside and outside electrodes 23 and 29 were switched while the pure water was kept supplied to the inside processing chamber $20_1$ and the outside processing chamber $20_2$. That is, the positive terminal of the DC power supply 36 was connected to the inside electrode 23 fixed to the surface of the $H^+$ ion exchange membrane 19 on the side of the inside processing chamber $20_1$, and the negative terminal was connected to the outside electrode 29 fixed to the surface of the $H^+$ ion exchange membrane 19 on the side of the outside processing chamber $20_2$. A voltage shown in Table 3 was applied to the electrodes 23 and 29 thus connected, thereby producing an $H^+$-rich solution in the inside processing chamber $20_1$. This $H^+$-rich solution was introduced from the inside processing chamber $20_1$ into the nozzle hole 10 through the cleaning solution passages 17, passed through the nozzle 5 communicating with the nozzle hole 10, and sprayed at a flow rate of 0.8 L/min for 30 sec upon the surface of the rotating silicon wafer 137 from the circular discharge port 4 at the lower end of the nozzle 5. Simultaneously, the cleaning solution spray 2 was moved back and forth at a speed of 1.0 m/min within the range of the radius of the silicon wafer 137. In this manner, acid cleaning was performed for the silicon wafer 137.

EXAMPLES 10 & 11

In the cylindrical cleaning solution spray 2, an $OH^-$-rich solution was introduced from the inside processing chamber $20_1$ of the cylindrical main body 6 into nozzle hole 10 as in Example 9. At the same time, a radio frequency was supplied from the RF oscillator 79 to the disk-like vibrator 67 immediately above the nozzle hole 10, thereby vibrating the vibrator 67 at different frequencies shown in Table 3 and producing radicals in the $OH^-$-rich solution. The resultant solution was carried on ultrasonic waves and sprayed at a flow rate of 0.8 L/min for 30 sec upon the surface of the rotating semiconductor wafer 137 from the discharge port 4 of the nozzle 5 in the lower portion of the cylindrical main body 6. Simultaneously, the cleaning solution spray 2 was moved back and forth at a speed of 1.0 m/min within the range of the radius of the silicon wafer 137. In this manner, alkali cleaning was performed for the silicon wafer 137.

Subsequently, in the cylindrical cleaning solution spray 2, the connecting polarities between the DC power supply 36 and the inside and outside electrodes 23 and 29 were switched while the pure water was kept supplied to the inside processing chamber $20_1$ and the outside processing chamber $20_2$, following the same procedure as in Example 9, thereby producing an $H^+$-rich solution in the inside processing chamber $20_1$ of the cylindrical main body 6. This $H^+$-rich solution was introduced into the nozzle hole 10 and at the same time a radio frequency was supplied from the RF oscillator 79 to the disk-like vibrator 67 immediately above the nozzle hole 10, thereby vibrating the vibrator 67 at different frequencies shown in Table 3 and producing radicals in the $H^+$-rich solution. The resultant solution was carried on ultrasonic waves and sprayed at a flow rate of 0.8 L/min for 30 sec upon the surface of the rotating silicon wafer 137 from the discharge port 4 of the nozzle 5 in the lower portion of the cylindrical main body 6. Simultaneously, the cleaning solution spray 2 was moved back and forth at a speed of 1.0 m/min within the range of the radius of the silicon wafer 137. In this way, acid cleaning was performed for the silicon wafer 137.

Silicon particles with particle sizes of 0.18 or more on the surfaces of ten silicon wafers cleaned in Examples 9 to 11 were counted by a particle counter LS-6030 (tradename) commercially available from Hitachi Electronics Engineering, Co., Ltd., and the average values were calculated. The results are shown in Table 3 below.

Also, the surfaces of ten silicon wafers cleaned in Examples 9 to 11 were cleaned with dilute hydrofluoric acid. The amounts of Al, Cu, and Fe of the resultant solutions were measured by ICP mass spectrometry, and the average values were calculated. The results are summarized in Table 3 below.

TABLE 3

| Applied voltage (V) | Ultrasonic action | Cleaning method | Particle measurement result (particles/ 200 mm diameter substrate) | Surface metal impurity level (atoms/cm$^2$) | | |
|---|---|---|---|---|---|---|
| | | | | Al | Cu | Fe |
| Example 9 | 60 | None | spray of OH$^-$-rich solution | 956 | N.D. | $1.0 \times 10^8$ | $1.5 \times 10^8$ |
| | 60 | None | spray of H$^+$-rich solution | | | | |
| Example 10 | 60 | 800 kHz | spray of OH$^-$-rich solution | 334 | N.D. | N.D. | N.D. |
| | 60 | 800 kHz | spray of H$^+$-rich solution | | | | |
| Example 11 | 60 | 1.5 MHz | spray of OH$^-$-rich solution | 196 | N.D. | N.D. | N.D. |
| | 60 | 1.5 MHz | spray of H$^+$-rich solution | | | | |

As can be seen from Table 3, the cleaning method of Example 9 in which an OH$^-$-rich solution (cleaning solution) and an H$^+$-rich solution (cleaning solution) were successively sprayed upon a silicon wafer by using the cylindrical cleaning solution spray could remove particles from the surface of the silicon wafer better than in the cleaning method of Example 2 and also could remove surface metal impurities from the silicon wafer better than in the cleaning method of Example 6.

Additionally, the cleaning methods of Examples 10 and 11 in which an OH$^-$-rich solution (cleaning solution) and an H$^+$-rich solution (cleaning solution) were sprayed upon a silicon wafer by making ultrasonic waves act on these solutions by using the cylindrical cleaning solution spray could remove particles from the surface of the silicon wafer better than in the cleaning method of Example 9 and also had the ability to remove surface metal impurities higher than that of the cleaning method of Example 9. Therefore, the cleaning methods of Examples 10 and 11 could perform precise cleaning.

Note that in Examples 1 to 11, cleaning was similarly performed by using the bar type cleaning solution spray 202 shown in FIGS. 8 to 14, instead of the cylindrical cleaning solution spray 2 shown in FIGS. 1 to 6. As a consequence, particles and surface metal impurities could be removed better because the bar type cleaning solution spray 202 could spray a cleaning solution upon a wider area of the surface of a silicon wafer than when the cylindrical cleaning solution spray 2 was used. On the other hand, the cleaning using the bar type cleaning solution spray 202 achieved the removal of particles and surface metal impurities equivalent to that achieved by the cleaning using the cylindrical cleaning solution spray 2 even if the spray time of the cleaning apparatus was shortened compared to that when the cleaning using the cylindrical cleaning solution spray 2 was used.

Semiconductor wafers were used as substrates to be cleaned in Examples 1 to 11 described above. However, the present invention can be similarly applied to liquid crystal glass substrates and magnetic disks.

As has been described above, the present invention can provide a cleaning apparatus in which a cleaning solution spray means itself is given a function of producing OH$^-$ ionized water and H$^+$ ionized water and can spray OH$^-$ ionized water and H$^+$ ionized water, as cleaning solutions immediately after they are produced, upon an object to be cleaned, and one of OH$^-$ ionized water and H$^+$ ionized water can be selectively used as a cleaning solution, and which is effectively applicable to cleaning steps in the manufacture of semiconductor devices, liquid crystal display devices, and magnetic disks.

Also, the present invention can provide a cleaning apparatus in which a cleaning solution spray means itself is given a function of producing OH$^-$ ionized water and H$^+$ ionized water and can spray OH$^-$ ionized water and H$^+$ ionized water, as cleaning solutions immediately after they are produced, by carrying them on ultrasonic waves, upon an object to be cleaned at a high pressure, and one of OH$^-$ ionized water and H$^+$ ionized water can be selectively used as a cleaning solution, and which is effectively applicable to cleaning steps in the manufacture of semiconductor devices, liquid crystal display devices, and magnetic disks.

Additionally, the present invention can provide a cleaning method capable of precisely cleaning a substrate to be cleaned by using the above cleaning apparatuses without increasing the number of steps.

Furthermore, the present invention can provide a cleaning apparatus which can precisely clean both the upper and lower surfaces of a rotatable substrate to be cleaned at the same time by arranging a cleaning solution spray means given a function of producing OH$^-$ ionized water and H$^+$ ionized water above the substrate and arranging another cleaning solution spray means having the same structure or a different structure below the substrate, and which is effectively applicable to cleaning steps in the manufacture of semiconductor devices, liquid crystal display devices, and magnetic disks.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A cleaning apparatus comprising:

substrate holding means for holding a substrate to be cleaned;

cleaning solution spray means, comprising a cylindrical main body having nozzle in one end of which a circular cleaning solution discharge port is open for spraying a cleaning solution upon said substrate from said nozzle;

solution supply means for supplying an aqueous solution into said cylindrical main body of said spray means; and an electrolytic ion generating member, disposed in said cylindrical main body of said spray means, for radically activating or ionizing water in said aqueous solution introduced into said cylindrical main body of said spray means to prepare said cleaning solution.

2. The cleaning apparatus according to claim 1, wherein said cleaning solution spray means further comprises an ultrasonic wave generating member disposed in said cylindrical main body of said spray means.

3. The cleaning apparatus according to claim 2, wherein said ultrasonic wave generating member is disposed in said cylindrical main body of said cleaning solution spray means so as to be separated from an installation portion of said electrolytic ion generating member by a partition.

4. The cleaning apparatus according to claim 2, wherein said electrolytic ion generating member comprises an H$^+$ ion exchange membrane for partitioning said cylindrical main body of said cleaning solution spray means into an outer portion and a central portion, electrode plates disposed on both sides of said H$^+$ ion exchange membrane and having different polarities, and a DC power supply connected to said electrode plates, and a cleaning solution carried on ultrasonic waves by said ultrasonic wave generating member is sprayed upon said substrate through the space inside said H$^+$ ion exchange membrane of said cleaning solution spray means.

5. The cleaning apparatus according to claim 4, wherein positive and negative terminals of said DC power supply are interchangeably connected to said electrode plates having different polarities.

6. The cleaning apparatus according to claim 1, wherein two of said cleaning solution spray means are arranged on both sides of said substrate.

7. A cleaning apparatus comprising:

substrate holding means for holding a substrate to be cleaned;

cleaning solution spray means for spraying a cleaning solution upon said substrate, said cleaning solution spray means comprising (a) a cylindrical main body having a nozzle in one end of which a circular cleaning solution discharge port is open;

(b) a partition concentrically arranged in said main body to partition said main body into a first space in an outer portion and a second space positioned in a central portion and communicating with said nozzle;

(c) a plurality of cleaning solution passages formed in a portion of said partition near said nozzle and communicating said first space with said second space;

solution supplying means, connected to said outside processing chamber and said inside processing chamber partitioned by said H$^+$ ion exchange membrane in said cylindrical main body, for supplying an aqueous solution;

a cylindrical electrolytic ion generating member concentrically arranged in said first space and comprising an H$^+$ ion exchange membrane for partitioning said first space into an outside processing chamber and an inside processing chamber, electrode plates disposed on both sides of said H$^+$ ion exchange membrane and having different polarities and a DC power supply connected to said electrode plates, wherein said electrolytic ion generating member radically activates or ionizes water in said aqueous solution introduced into said outside processing chamber and said inside processing chamber respectively, to prepare said cleaning solution in said inside processing chamber; and an ultrasonic wave generating member, arranged in said second space of said main body, for carrying ultrasonic waves on said cleaning solution.

8. The cleaning apparatus according to claim 7, wherein positive and negative terminals of said DC power supply are interchangeably connected to said electrode plates having different polarities.

9. The cleaning apparatus according to claim 7, wherein said cleaning solution spray means further comprises electrolytic processing solution discharge means connected to said main body so as to communicate with said outside processing chamber.

10. The cleaning apparatus according to claim 7, wherein said cleaning spray means further comprises venting means connected to said outside and inside processing chambers partitioned by said H$^+$ ion exchange membrane in said cylindrical main body.

11. A cleaning apparatus comprising:

rotating means for horizontally rotating a substrate to be cleaned;

first cleaning solution spray means, arranged above said rotating means, for spraying a cleaning solution upon an upper surface of said substrate supported by said rotating means and comprising (a) a cylindrical main body having a nozzle in one end of which a circular cleaning solution discharge port is open;

(b) a partition concentrically arranged in said main body to partition said main body into a first space in an outer portion and a second space positioned in a central portion and communicating with said nozzle;

(c) a plurality of cleaning solution passages formed in a portion of said partition near said nozzle and communicating said first space with said second space;

solution supplying means, connected to said outside processing chamber and said inside processing chamber partitioned by said H$^+$ ion exchange membrane in said cylindrical main body, for supplying an aqueous solution;

a cylindrical electrolytic ion generating member concentrically arranged in said first space and comprising an ion exchange membrane for partitioning said first space into an outside processing chamber and an inside processing chamber, electrode plates disposed on both sides of said H$^+$ ion exchange membrane and having different polarities and a DC power supply connected to said electrode plates, wherein said electrolytic ion generating member radically activates or ionizes water in said aqueous solution introduced into said outside processing chamber and said inside processing chamber, respectively, to prepare said cleaning solution in said inside processing chamber;

an ultrasonic wave generating member, arranged in said second space of said main body, for carrying ultrasonic; and second cleaning solution spray means, arranged below said rotating means, for spraying a cleaning solution upon a lower surface of said substrate supported by said rotating means.

12. The cleaning apparatus according to claim 11, wherein said rotating means has a structure comprising a cylindrical fixed shaft also serving as a cleaning solution supply member of said second cleaning solution spray means, a rotary support member rotatably engaging with said fixed shaft to horizontally support said substrate, and a driving mechanism for rotating said rotary support member.

13. The cleaning apparatus according to claim 12, wherein said driving mechanism comprises a timing pulley to be driven attached to said rotary support member, a driving timing pulley, a timing belt looped between said pulleys, and a motor for rotating said driving timing pulley.

14. The cleaning apparatus according to claim 11, wherein said second cleaning solution spray means comprises a shower nozzle horizontally connected integrally with a cylindrical fixed shaft also serving as a cleaning solution supply unit, said shower nozzle comprises a nozzle body horizontally connected integrally with said cylindrical fixed shaft and having a cleaning solution passage communicated with a hollow portion of said fixed shaft, and a plurality of cleaning solution spray holes opened in an upper portion of said nozzle body so as to communicate with said passage.

15. The cleaning apparatus according to claim 11, wherein positive and negative terminals of said DC power supply of said cylindrical electrolytic ion generating member are interchangeably connected to said electrode plates having different polarities.

16. The cleaning apparatus according to claim 11, wherein said first cleaning solution spray means is moved back and forth in a radial direction from a rotating center of said substrate.

17. A cleaning apparatus comprising:

substrate holding means for holding a substrate to be cleaned; and cleaning solution spray means for spraying a cleaning solution upon said substrate, wherein said cleaning solution spray means comprises
(a) a rectangular main body comprising a nozzle hole in a lower surface of which an elongated cleaning solution discharge port is open, and an elongated processing chamber communicating with said nozzle hole,
(b) an electrolytic ion generating member comprising an elongated $H^+$ ion exchange membrane for partitioning said processing chamber in said main body into inside and outside processing chambers communicating with said nozzle hole along a longitudinal direction, elongated electrode plates disposed on both sides of said $H^+$ ion exchange membrane and having different polarities, and a DC power supply connected to said electrode plates, said electrolytic ion generating member produces radical-activating or ionizing pure water, and
(c) an ultrasonic wave generating member arranged on an upper surface of said main body to propagate ultrasonic waves to a cleaning solution in said nozzle hole, and a radical-activated or ionized cleaning solution produced in said inside processing chamber of said $H^+$ ion exchange membrane is introduced into said nozzle hole and sprayed in the form of a belt upon said substrate from said elongated discharge port of said nozzle hole by the ultrasonic waves from said ultrasonic wave generating member.

18. The cleaning apparatus according to claim 17, wherein positive and negative terminals of said DC power supply are interchangeably connected to said electrode plates having different polarities.

19. The cleaning apparatus according to claim 17, wherein said cleaning solution spray means further comprises pure water supply means connected to said inside and outside processing chambers partitioned by said $H^+$ ion exchange membrane in said rectangular main body, and electrolytic processing solution discharge means connected to said outside processing chamber of said main body.

20. The cleaning apparatus according to claim 17, wherein said cleaning solution spray means further comprises venting means connected to said inside and outside processing chambers partitioned by said $H^+$ ion exchange membrane in said rectangular main body.

21. A cleaning method of cleaning a substrate to be cleaned by using a cleaning apparatus comprising:

substrate holding means for holding said substrate; and cleaning solution spray means comprising an electrolytic ion generating member having an $H^+$ ion exchange membrane for partitioning an outside processing chamber and a central processing chamber and electrode plates disposed on both sides of said $H^+$ ion exchange membrane and having different polarities, wherein pure water is supplied to said outside and central processing chambers while a DC voltage is applied to said electrode plates having different polarities, and a cleaning solution produced by radical-activating or ionizing the pure water in said central processing chamber is sprayed upon said substrate, thereby cleaning said substrate.

22. A cleaning method of cleaning a substrate to be cleaned by using a cleaning apparatus comprising:

substrate holding means for holding a substrate to be cleaned;

cleaning solution spray means for spraying a cleaning solution upon said substrate, said cleaning solution spray means comprising
(a) a cylindrical main body having a nozzle in one end of which a circular cleaning solution discharge port is open;
(b) a partition concentrically arranged in said main body to partition said main body into a first space in an outer portion and a second space positioned in a central portion and communicating with said nozzle;
(c) a plurality of cleaning solution passages formed in a portion of said partition near said nozzle and communicating said first space with said second space;

solution supplying means, connected to said outside processing chamber and said inside processing chamber partitioned by said $H^+$ ion exchange membrane in said cylindrical main body, for supplying an aqueous solution;

a cylindrical electrolytic ion generating member concentrically arranged in said first space and comprising an $H^+$ ion exchange membrane for partitioning said first space into an outside processing chamber and an inside processing chamber, electrode plates disposed on both sides of said $H^+$ ion exchange membrane and having different polarities, and a DC power supply connected to said electrode plates; and an ultrasonic wave generating member arranged in said second space of said main body;

wherein an a aqueous solution is supplied to said outside and inside processing chambers while a DC voltage is applied to said electrode plates having different polarities to radically activate or ionize water in said aqueous solution introduced into said outside and inside processing chamber, ultrasonic waves are simultaneously propagated from said ultrasonic wave generating member to the aqueous solution flowing through said inside processing chamber, thereby preparing a cleaning solution contained radically activated or ionized water and carrying the ultrasonic waves on said cleaning solution to spray said cleaning solution upon said substrate from said nozzle of said spraying means so as to clean said substrate.

23. The method according to claim 22, wherein polarities of said DC power supply to be applied to said electrode plates are switched when the cleaning solution is sprayed upon said substrate.

* * * * *

UNITED STATES PATENT AND TRADEMARK OFFICE

CERTIFICATE OF CORRECTION

PATENT NO. : 6,003,527
DATED : December 21, 1999
INVENTOR(S) : Netsu et al

It is certified that error appears in the above-identified patent and that said letters patent is hereby corrected as shown below:

Title page format at item [75], "Kualo Lumpur" should be read as --Kuala Lumpur--.

Signed and Sealed this

Ninth Day of January, 2001

Attest:

Q. TODD DICKINSON

Attesting Officer    Commissioner of Patents and Trademarks